(12) United States Patent
Weis

(10) Patent No.: US 9,859,274 B2
(45) Date of Patent: Jan. 2, 2018

(54) INTEGRATED CIRCUIT WITH AT LEAST TWO SWITCHES

(75) Inventor: Rolf Weis, Dresden (DE)

(73) Assignee: Infineon Technologies Dresden GmbH, Dresden (DE)

(*) Notice: Subject to any disclaimer, the term of this patent is extended or adjusted under 35 U.S.C. 154(b) by 0 days.

(21) Appl. No.: 13/546,555

(22) Filed: Jul. 11, 2012

(65) Prior Publication Data

US 2014/0015592 A1 Jan. 16, 2014

(51) Int. Cl.
*H01L 27/088* (2006.01)
*H03K 17/10* (2006.01)

(52) U.S. Cl.
CPC ....... *H01L 27/0886* (2013.01); *H03K 17/102* (2013.01)

(58) Field of Classification Search
CPC ...... H03K 17/102; H03K 17/567; H03F 1/22; H03F 1/223; H03F 1/226
USPC ........ 327/108–112, 306, 309, 310, 313, 427, 327/430
See application file for complete search history.

(56) References Cited

U.S. PATENT DOCUMENTS

| | | | |
|---|---|---|---|
| 4,692,643 A * | 9/1987 | Tokunaga et al. | 327/436 |
| 4,751,408 A * | 6/1988 | Rambert | 327/436 |
| 5,742,491 A | 4/1998 | Bowman et al. | |
| 5,870,031 A | 2/1999 | Kaiser et al. | |
| 6,005,415 A * | 12/1999 | Solomon | 326/83 |
| 6,097,257 A | 8/2000 | Kadowaki et al. | |
| 6,798,256 B1 * | 9/2004 | Hazucha et al. | 327/111 |
| 7,158,392 B2 | 1/2007 | Hosokawa et al. | |
| 7,301,388 B2 | 11/2007 | Kim | |

(Continued)

FOREIGN PATENT DOCUMENTS

| | | |
|---|---|---|
| CN | 101897112 A | 11/2010 |
| DE | 2352654 A | 5/1974 |

(Continued)

OTHER PUBLICATIONS

Weis, Rolf. "Semiconductor Arrangement with Active Drift Zone." U.S. Appl. No. 13/362,033, filed Jan. 31, 2012.

(Continued)

*Primary Examiner* — Lincoln Donovan
*Assistant Examiner* — Colleen O Toole
(74) *Attorney, Agent, or Firm* — Murphy, Bilak & Homiller, PLLC

(57) ABSTRACT

A circuit includes first and second semiconductor switches each having a load path and control terminal and their load paths connected in series. At least one of the first and second switches includes a first semiconductor device having a load path and a control terminal, the control terminal coupled to the control terminal of the switch. A plurality of second semiconductor devices each have a load path between a first load terminal and a second load terminal and a control terminal. The second semiconductor devices have their load paths connected in series and connected in series to the load path of the first semiconductor device. Each of the second semiconductor devices has its control terminal connected to the load terminal of one of the other second semiconductor devices. One of the second semiconductor devices has its control terminal connected to one of the load terminals of the first semiconductor device.

15 Claims, 13 Drawing Sheets

(56) References Cited

U.S. PATENT DOCUMENTS

| | | |
|---|---|---|
| 8,031,498 B2 | 10/2011 | Deboy et al. |
| 8,111,104 B2 | 2/2012 | Ahadian et al. |
| 8,193,559 B2 | 6/2012 | Haeberlen et al. |
| 8,569,842 B2 | 10/2013 | Weis et al. |
| 8,618,698 B2 | 12/2013 | Aiello et al. |
| 8,866,253 B2 | 10/2014 | Weis et al. |
| 8,971,080 B2 | 3/2015 | Weis et al. |
| 8,995,158 B2 | 3/2015 | Weis et al. |
| 9,252,140 B2* | 2/2016 | Zojer .................. B60R 21/017 |
| 2009/0140707 A1 | 6/2009 | Deboy |
| 2010/0078694 A1* | 4/2010 | Willmeroth et al. ......... 257/296 |
| 2012/0175634 A1 | 7/2012 | Weis |
| 2012/0175635 A1 | 7/2012 | Weis et al. |
| 2013/0020635 A1* | 1/2013 | Yilmaz ................. H01L 27/088 |
| | | 257/334 |
| 2013/0193525 A1 | 8/2013 | Weis et al. |
| 2014/0016386 A1 | 1/2014 | Weis et al. |
| 2014/0062544 A1 | 3/2014 | Weis et al. |

FOREIGN PATENT DOCUMENTS

| | | |
|---|---|---|
| DE | 10243571 A1 | 4/2004 |
| DE | 102007046705 B3 | 4/2009 |
| WO | 2012093177 A2 | 7/2012 |

OTHER PUBLICATIONS

Weis, Rolf, et al. "Semiconductor Arrangement with Active Drift Zone ." U.S. Appl. No. 13/362,038, filed Jan. 31, 2012.

\* cited by examiner

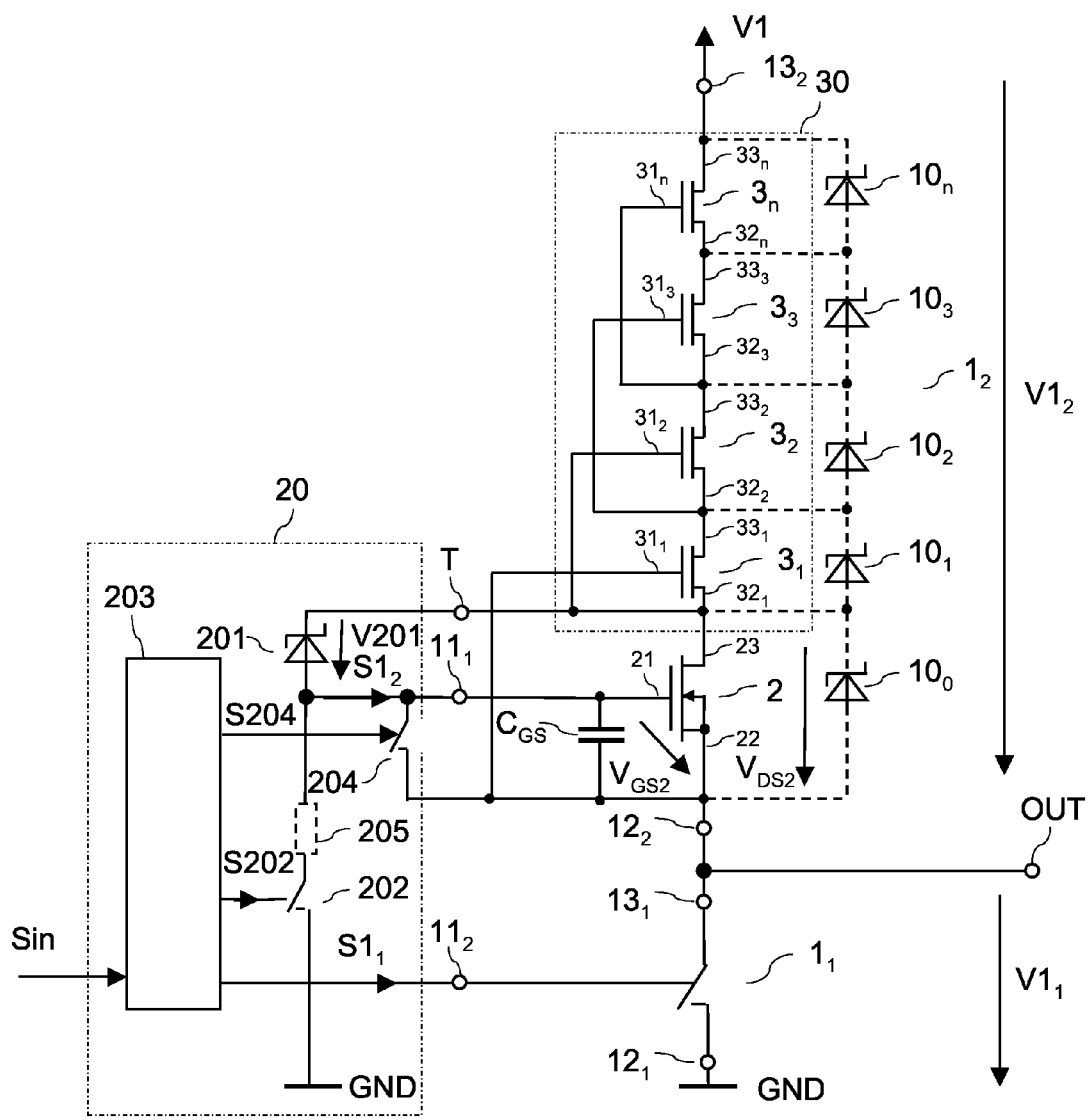
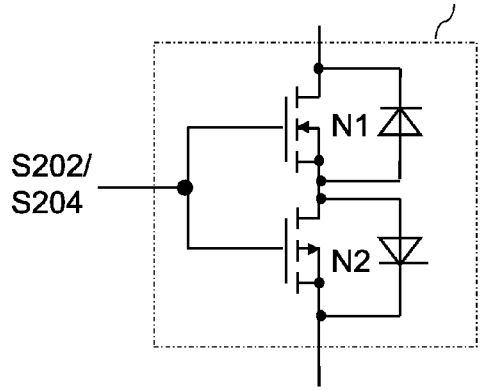
FIG 8
FIG 9

INTEGRATED CIRCUIT WITH AT LEAST TWO SWITCHES

TECHNICAL FIELD

Embodiments of the present invention relate to an integrated circuit with at least two switches, such as a half-bridge circuit.

BACKGROUND

A conventional half-bridge circuit includes two semiconductor switches, such as MOSFETs or IGBTs, each including a load path and a control terminal. The load paths of the two semiconductor switches are connected in series, where a circuit node between the load paths of the two semiconductor switches forms an output of the half-bridge circuit.

Half-bridge circuits are widely used in automotive or industrial circuit applications, e.g., in power converters, or in drive circuits for inductive loads.

SUMMARY

A first embodiment relates to a circuit arrangement including a half-bridge circuit with a first semiconductor switch and a second semiconductor switch. Each of the first semiconductor switch and the second semiconductor switch includes a load path and a control terminal, and the first semiconductor switch and the second semiconductor switch have their load paths connected in series. At least one of the first and second semiconductor switches includes a first semiconductor device having a load path and a control terminal, a plurality of second semiconductor devices, each having a load path between a first load terminal and a second load terminal and a control terminal. The second semiconductor devices have their load paths connected in series and connected in series to the load path of the first semiconductor device, each of the second semiconductor devices has its control terminal connected to the load terminal of one of the other second semiconductor devices, and one of the second semiconductor devices has its control terminal connected to one of the load terminals of the first semiconductor device.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 8 illustrates a circuit arrangement with a half-bridge circuit and a drive circuit according to a first embodiment;

FIG. 9 illustrates one embodiment of bidirectionally blocking switch;

FIG. 11 that includes

FIG. 12 that includes

FIG. 17 that includes

FIG. 26 that includes

DETAILED DESCRIPTION

In the following detailed description, reference is made to the accompanying drawings, which form a part thereof, and in which is shown by way of illustration specific embodiments in which the invention may be practiced.

Figure 1:
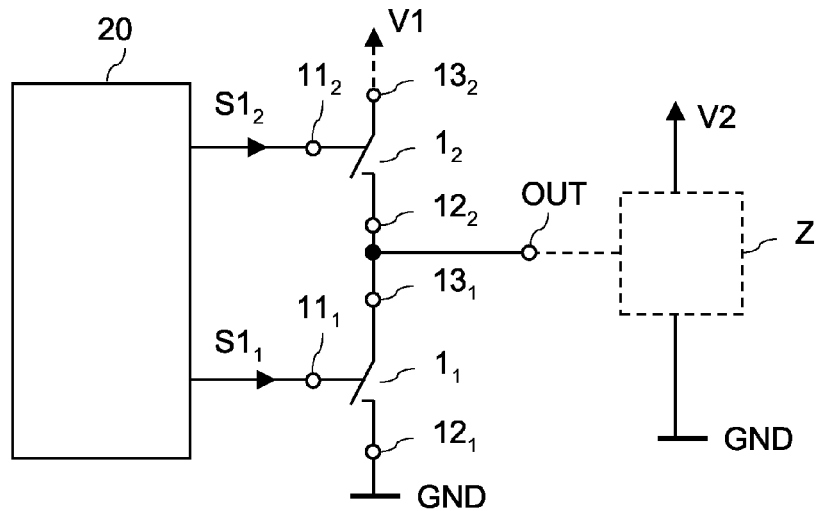
FIG. 1 illustrates a circuit arrangement with a half-bridge circuit including a first and a second semiconductor switch.

FIG. 1 illustrates an embodiment of a circuit arrangement with a half-bridge circuit (which will simply be referred to as half-bridge in the following). The half-bridge includes a first switch $1_1$ and a second switch $1_2$, each having a control terminal $11_1$, $11_2$ and a load path between a first load terminal $12_1$, $12_2$ and a second load terminal $13_1$, $13_2$. The load paths of the two switches $1_1$, $1_2$ are connected in series. In operation of the half-bridge, the series circuit is connected between a terminal for a first supply potential V1 and a second supply potential GND. According to one embodiment, the first supply potential V1 is a positive supply potential, while the second supply potential GND is a negative supply potential or a reference potential, such a ground. The first switch $1_1$ that is closer to the negative supply potential GND in the series circuit will be referred to as low-side switch in the following, while the second switch $1_2$ that is closer to the positive supply potential V1 will be referred to as high-side switch in the following.

The half-bridge includes an output OUT for connecting a load Z (illustrated in dashed lines) thereto. The output OUT is a circuit node of the series circuit between the load paths of the first and second switch $1_1$, $1_2$. In the embodiment of FIG. 1, the output OUT corresponds to the second load terminal $13_1$ of the low-side switch $1_1$ and the second load terminal $12_2$ of the high-side switch $1_2$. However, this is only an example. Additional circuit elements, such as resistors or inductors (not illustrated) may be connected between the load paths of the switches $1_1$, $1_2$. In this case, the output OUT may correspond to any of the load terminals $12_2$, $13_1$ or to a circuit node between these load terminal $12_2$, $13_1$. The load Z may be connected to one or both of a further positive supply potential V2 and the reference potential GND.

Referring to FIG. 1, the circuit arrangement further includes a drive circuit 20 coupled to the control terminals $11_1$, $11_2$ of the switches $1_1$, $1_2$ and configured to switch on and off the switches $1_1$, $1_2$ in accordance with a desired drive scheme. The drive scheme may be dependent on the type of load Z connected to the half-bridge and driven by the half-bridge.

The first and second switches $1_1$, $1_2$ are implemented as semiconductor switches. That is, each of these switches $1_1$, $1_2$ is integrated in a semiconductor body (not illustrated in FIG. 1). According to one embodiment, the two switches $1_1$, $1_2$ are integrated in a common semiconductor body. This will be explained in further detail herein below.

Half-bridges, such as the half-bridge illustrated in FIG. 1, can be used in a variety of industrial or automotive circuits. Examples of such circuits (without restricting the application of half-bridges to these specific circuits) are power converter circuits or drive circuits for loads, in particular for inductive loads, such as magnetic valves.

Figure 2:
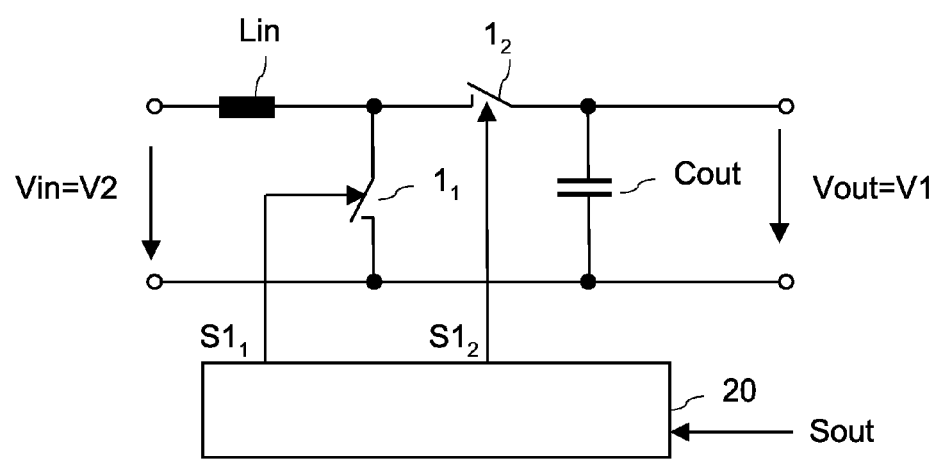
FIG. 2 illustrates a first embodiment of a power converter circuit including a half-bridge circuit.

FIG. 2 illustrates a first embodiment of a power converter circuit including a half-bridge. This power converter circuit includes input terminals for applying an input voltage Vin and output terminals Vout for providing an output voltage Vout. The half-bridge is connected between the output terminals. That is, the series circuit with the load paths of the first and second switch $1_1$, $1_2$ is connected between the output terminals. An output capacitor Cout is connected between the output terminals and, therefore, in parallel to the half-bridge. An inductive storage element Lin is connected to the output OUT of the half-bridge, where a series circuit with the inductive storage element Lin and the low-side switch $1_1$ is connected between input terminals for applying an input voltage Vin.

The power converter of FIG. 2 is implemented as a boost converter, which is a converter in which the output voltage Vout is higher than the input voltage Vin. The drive circuit 20 provides a pulse-width modulated (PWM) drive signal $S1_1$, $S1_2$ to each of the first and second switches $1_1$, $1_2$, where the drive circuit 20 generates the drive signals $S1_1$, $S1_2$ such that the two switches are not switched on (conducting) at the same time. Further, a duty-cycle of these drive signals $S1_1$, $S1_2$ is adjusted such that the output voltage Vout corresponds to a desired set voltage. An output voltage signal Sout received by the control circuit represents the output voltage Vout and allows the control circuit to regulate the output voltage be suitably selecting the duty cycle of the drive signals $S1_1$, $S1_2$.

The operating principle of the power converter circuit of FIG. 2 is as follows: Each time the low-side switch $1_1$ is switched on energy is magnetically stored in the inductive storage element Lin. When the low-side switch $1_1$ is switched off and high-side switch $1_2$ is switched on, the energy stored in the inductive storage element Lin is transferred to the output terminals and the output capacitor Cout, respectively. This operating principle of a boost converter is commonly known, so that no further explanations are required in this regard.

Figure 3:
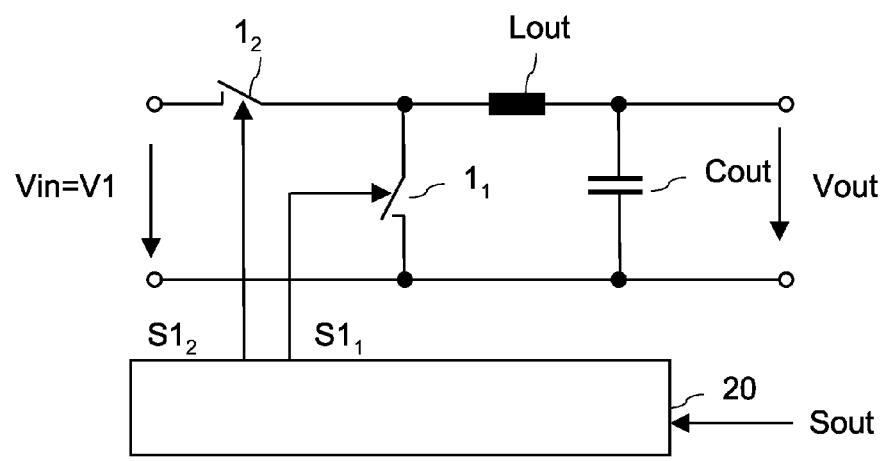
FIG. 3 illustrates a second embodiment of a power converter circuit including a half-bridge circuit.

FIG. 3 shows an embodiment of a power converter circuit implemented as a buck converter. In this case, the half-bridge is connected between the input terminals, while a series circuit with an inductive storage element Lout and the output capacitor Cout is connected between the output terminal OUT and the negative supply potential (reference potential) GND. An output voltage Vout is available across the output capacitor Cout.

In the buck converter, the output voltage Vout is smaller than the input voltage Vin. The drive circuit 20 is configured to provide PWM drive signals $S1_1$, $S1_2$ to the first and second switch $1_1$, $1_2$ such that these switches $1_1$, $1_2$ are not switched on at the same time. Further, the duty-cycle of the drive signals $S1_1$, $S1_2$ is adjusted such that the output voltage Vout corresponds to a pre-defined set voltage. The operating principle of the buck converter of FIG. 3 is as follows: When the second switch (high-side switch) $1_2$ is switched on, energy is magnetically stored in the inductive storage element Lout and the output capacitor Cout is charged. When the second switch $1_2$ is switched off and the first switch $1_1$ is switched on, the first switch $1_1$ acts as a free-wheeling element that allows the current through the inductive storage element Lout to further flow and the inductive storage element Lout to transfer the stored energy to the output capacitor Cout and/or a load (not illustrated) coupled to the output terminals. This operating principle is commonly known, so that no further explanations are required in this regard.

Figure 4:
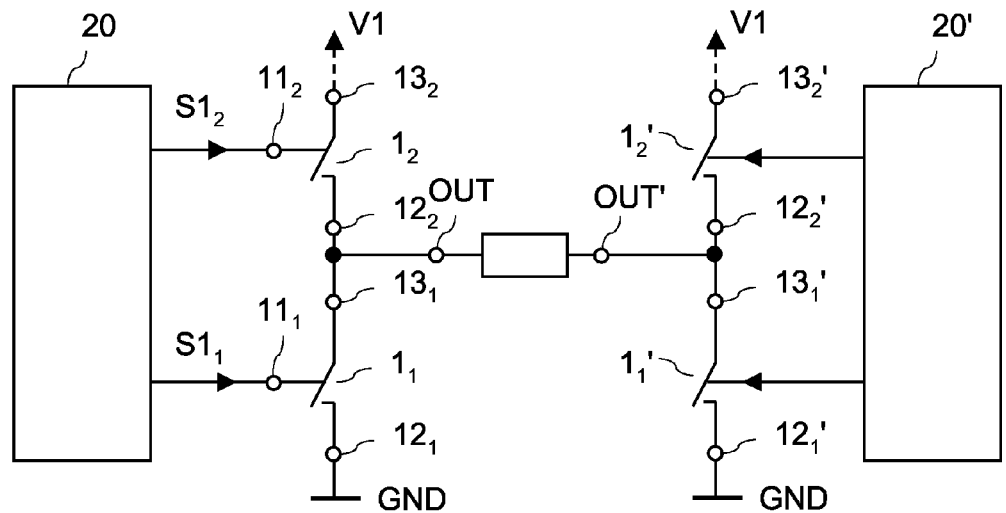
FIG. 4 illustrates a circuit arrangement with a full-bridge circuit including two half-bridge circuits.

FIG. 4 illustrates an embodiment of a full-bridge circuit. This full-bridge circuit includes two half-bridge circuits of the type explained with reference to FIG. 1. The load Z is connected between outputs OUT, OUT of the half-bridges. The load Z is, e.g. an inductive load, such as a motor, an inductive valve, or the like.

At least one of the first and second switches $1_1$, $1_2$ of the half-bridge is implemented with semiconductor arrangement that includes a first semiconductor device and a plurality of second semiconductor devices. A first embodiment of such semiconductor arrangement for implementing one of the first and second switches $1_1$, $1_2$ is explained with reference to FIG. 5 below.

Figure 5:
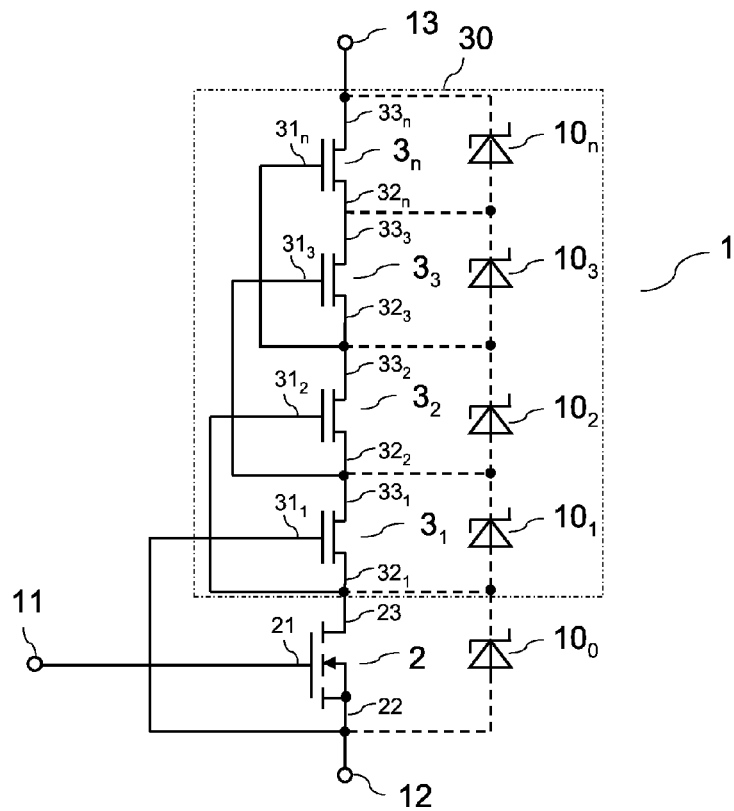
FIG. 5 illustrates a first embodiment of an implantation of at least one of the first and second semiconductor switches of the half-bridge circuit.

In FIG. 5, reference character 1 denotes one of the first and second semiconductor switches $1_1$, $1_2$, where only one or both of these switches $1_1$, $1_2$ may be implemented as illustrated in FIG. 5. Further, reference character 11 denotes the control terminal, and reference characters 12, 13 denote the first and second load terminals, respectively.

Referring to FIG. 5, the semiconductor switch (semiconductor arrangement) 1 includes a first semiconductor device 2 and a plurality of second semiconductor devices $3_1$-$3_n$. The first semiconductor device 2 has a load path between a first load terminal 22 and a second load terminal 23 and a control terminal 21 and can assume one of an on-state, in which the load path conducts a current, and an off-state, in which the load paths blocks. The first semiconductor device 2 according to FIG. 1 is implemented as a transistor device (transistor). Specifically, the first semiconductor device according to FIG. 5 is implemented as a MOSFET where the control terminal 21 is a gate terminal and the first and second 22, 23 load terminals are source and drain terminals, respectively. The first transistor device will be referred to as first transistor in the following In FIG. 5 as well as in the following figures reference number "3" followed by a subscript index denotes the individual second semiconductor devices. Same parts of the individual second semiconductor devices, such as control terminals and load terminals, have the same reference character followed by an subscript index. For example, $3_1$ denotes a first one of the second semiconductor devices that has a control terminal $31_1$ and first and second load terminals $32_1$, $33_1$. In the following, when reference is made to an arbitrary one of the second semiconductor devices or to the plurality of the second semiconductor devices, and when no differentiation between individual second semiconductor devices is required, reference numbers 3, 31, 32, 33 without indices will be used to denote the second semiconductor devices and their individual parts.

The second semiconductor devices 3 are implemented as transistor devices (transistors) in the embodiment illustrated in FIG. 5 and will be referred to as second transistors in the following. Each of the second transistors 3 has a control terminal 31 and a load path between a first load terminal 32 and a second load terminal 33. The load paths 32-33 of the second semiconductor devices are connected in series with each other so that the first load terminal of one second transistor is connected to the second load terminal of an adjacent second transistor. Further, the load paths of the second transistors 3 are connected in series with the load path 22-23 of the first semiconductor device 2, so that the first semiconductor device 1 and the plurality of second transistors 3 form a cascode-like circuit.

Referring to FIG. 5, there are n second transistors 3, with n>1. From these n second transistors 3, a first second transistors $3_1$ is the second transistor that is arranged closest to first semiconductor device 2 in the series circuit with the n second transistors 3 and has its load path $32_1$-$33_1$ directly connected to the load path 22-23 of the first semiconductor device 2. An n-th second transistors 3, is the second transistor that is arranged most distant to first semiconductor device 2 in the series circuit with the n second transistors 3. In the embodiment illustrated in FIG. 5, there are n=4 second transistors 3. However, this is only an example, the number n of second transistors 3 can be selected arbitrarily, namely dependent on a desired voltage blocking capability of the semiconductor device arrangement. This is explained in greater detail herein below.

Each of the second transistors 3 has its control terminal 31 connected to one of the load terminals of another one of the second transistors 3 or to one of the load terminals of the first transistor 2. In the embodiment illustrated in FIG. 1, the 1st second transistor $3_1$ has its control terminal $31_1$ connected to the first load terminal 22 of the first transistor 2. Each of the other second transistors $3_2$-$3_{n-1}$ have their control terminal $31_2$-$31_n$ connected to the first load terminal $32_1$-$32_{n-1}$ of the second transistor that is adjacent in the series circuit in the direction of the first semiconductor device 2. Assume, for explanation purposes, that $3_i$ is one of the second transistors $3_2$-$3_n$ other than the 1st second transistor $3_1$. In this case, the control terminal $31_i$ of this second transistor (upper second transistor) $3_i$ is connected to the first load terminal $32_{i-1}$ of an adjacent second transistor (lower second transistor) $3_{i-1}$. The first load terminal $32_{i-1}$ of the lower second transistor $3_{i-1}$ to which the control terminal of the upper second transistor $3_i$ is connected to is not directly connected to one of the load terminals $32_i$, $33_i$ of this upper second transistor $3_i$. According to a further embodiment (not illustrated), a control terminal $31_i$ of one second transistor $3_i$ is not connected to the first load terminal $31_{i-1}$ of that second transistor $3_{i-1}$ that is directly connected to the second transistor $3_i$, but is connected to the load terminal $32_{i-k}$ of a second transistor $3_{i-k}$, with k>1, farther away from the transistor. If, for example, k=2, then the control terminal $31_i$ of the second transistor $3_i$ is connected to the first load terminal $32_{i-2}$ of the second transistor $3_{i-2}$ that is two second transistors away from the second transistor $3_i$ in the direction of the first transistor 2 in the series circuit.

Referring to FIG. 5, the first transistor 2 and the second semiconductor transistors 3 can be implemented as MOSFETs. Each of these MOSFETs has a gate terminal as a control terminal 21, 31, a source terminal as a first load terminal 22, 32, and a drain terminal as a second load terminal 23, 33. MOSFETs are voltage controlled devices that can be controlled by the voltage applied between the gate and source terminals (the control terminal and the first load terminal). Thus, in the arrangement illustrated in FIG. 5, the 1st second transistors $3_1$ is controlled through a voltage that corresponds to the load path voltage of the first transistor 2, and the other second transistors $3_i$ are controlled through the load path voltage of at least one second transistor $3_{i-1}$ or $3_{i-2}$. The "load path" voltage of one MOSFET is the voltage between the first and second load terminal (drain and source terminal) of this MOSFET.

In the embodiment illustrated in FIG. 5, the first transistor 2 of the transistor arrangement 1 is a normally-off (enhancement) transistor, while the second transistors 3 are normally-on (depletion) transistors. However, this is only an example. Each of the first semiconductor device 2 and the second transistors 3 can be implemented as a normally-on transistor or as a normally-off transistor. The individual transistors can be implemented as n-type transistors or as p-type transistors.

Implementing the first transistor 2 and the second transistors 3 as MOSFETs is only an example. Any type of transistor can be used to implement the first semiconductor device 2 and the second transistors 3, such as a MOSFET, a MISFET, a MESFET, an IGBT, a JFET, a FINFET, a nanotube device, an HEMT, etc. Independent of the type of device used to implement the first semiconductor device 2 and the second semiconductor devices 3, these devices are connected such that each of the second semiconductor devices 3 is controlled by the load path voltage of at least one other second semiconductor devices 3 or the first semiconductor device 2 in the series circuit.

The semiconductor device arrangement 1 with the first transistor 2, and the second transistors 3 can be switched on and off like a conventional transistor by applying a suitable drive voltage to the first semiconductor device 2. The control terminal 21 of the first transistor 2 forms a control terminal 11 of the overall arrangement 1, and the first load terminal 21 of the first transistor 2 and the second load terminal of the n-th second transistor 3, form the first and second load terminals 12, 13, respectively, of the overall arrangement.

The operating principle of the semiconductor arrangement acting as switch 1 is explained in the following. Just for explanation purposes it is assumed that the first transistor 2 is implemented as an n-type enhancement MOSFET, that the second transistors 3 are implemented as n-type depletion MOSFETs or n-type JFETs, and that the individual devices 2, 3 are interconnected as illustrated in FIG. 5. The basic operating principle, however, also applies to semiconductor device arrangements implemented with other types of first and second semiconductor devices.

It is commonly known that depletion MOSFETs or JFETs, that can be used to implement the second transistors 3, are semiconductor devices that are in an on-state when a drive voltage (gate-source voltage) of about zero is applied, while depletion MOSFETs or JFETs are in an off-state when the absolute value of the drive voltage is higher than a pinch-off voltage of the device. The "drive voltage" is the voltage between the gate terminal and the source terminal of the device. In an n-type depletion MOSFET or JFET the pinch-off voltage is a negative voltage, while the pinch-off voltage is a positive voltage in a p-type depletion MOSFET or JFET.

When a (positive) voltage is applied between the second and first load terminals 13, 12 and when the first transistor 2 is switched on by applying a suitable drive potential to the control terminal 11, the 1st second transistor $3_1$ is conducting (in an on-state), the absolute value of the voltage across the load path 22-23 of the first transistor 2 is too low so as to pinch-off the 1st second transistor $3_1$. Consequently, the second transistor $3_2$ controlled by the load path voltage of second transistor $3_1$ is also starting to conduct, etc. In other words, the first transistor 2 and each of the second transistors 3 are finally conducting so that the semiconductor arrangement 1 is in an on-state. When the semiconductor arrangement 1 is in an on-state and when the first transistor 2 is switched off, the voltage drop across the load path of the first transistor 2 increases, so that the 1st second transistor $3_1$ starts to switch off when the absolute value of the load-path voltage reaches the pinch-off voltage of the 1st second transistor $3_1$. When a positive voltage is applied between the second load terminal 13 and the first load terminal 12 of the arrangement 1, the voltage between the second load terminal 23 and the first load terminal 22 of the first semiconductor device is also a positive voltage when the first semiconductor device 2 switches off. In this case, the gate-source voltage of the 1st second transistor $3_1$ is a negative voltage suitable to pinch this transistor $3_1$ off.

When the 1st second transistor $3_1$ is switched off, the voltage drop across its load path increases so that the 2nd second transistor $3_2$ is switched off, which in turn switches off the 3rd second transistor, and so on, until each of the second transistors 3 is switched off and the semiconductor device arrangement 1 is finally in a stable off-state. The external voltage applied between the second and first terminals 13 and 12 switches as many 2nd transistors from the on-state to the off-state as required to distribute the external voltage over the first semiconductor device 2 and the second transistors 3. When applying a low external voltage, some second transistor are still in the on-state, while others are in the off-state. The number of second transistors that are in the off-state increases as the external voltage increases. Thus, when a high external voltage is applied, that is in the range of the voltage blocking capability of the overall semiconductor device arrangement, the first semiconductor device and each of the second transistors are in the off-state When the semiconductor device arrangement 1 is in an off-state and when the first transistor 2 is switched on, the voltage drop across the load path of the first transistor 2 decreases so that it switches on the 1st second transistor $3_1$, which in turn switches on the 2nd second transistor $3_2$, and so on. This continues until each of the second transistors 3 is again switched on.

The switching states of the second transistors 3 connected in series with the first semiconductor device 2 are dependent on the switching state of the first semiconductor device 2 and follow the switching state of the first semiconductor device 2. Thus, the switching state of the semiconductor arrangement 1 is defined by the switching state of the first transistor 2. The semiconductor arrangement 1 is in an on-state when the first semiconductor device 2 is in an on-state, and the semiconductor arrangement 1 is in an off-state when the first semiconductor device 2 is in an off-state.

The semiconductor arrangement 1 has a low resistance between the first and second load terminals 12, 13 when it is in an on-state, and has a high resistance between the first and second load terminals 12, 13 when it is in an off-state. In the on-state, an ohmic resistance between the first and second load terminals 12, 13 corresponds to the sum of the on-resistances $R_{ON}$ of the first semiconductor device 2 and the second transistors 3. A voltage blocking capability, which is the maximum voltage that can be applied between the first and second load terminals 12, 13 when the semiconductor arrangement is in an off-state before an Avalanche breakthrough sets in, corresponds to the sum of the voltage blocking capabilities of the first transistor 2 and the second transistors 3. The first transistor 1 and the individual second transistors may have relatively low voltage blocking capabilities, such as voltage blocking capabilities of between 3V and 50V. However, dependent on the number n of second transistors 3 a high overall voltage blocking capability of up to several 100V, such as 600V or more, can be obtained.

The voltage blocking capability and the on-resistance of the semiconductor arrangement 1 are defined by the voltage blocking capabilities of the first transistor 2 and the second transistors 3 and by the on-resistances of the first transistor 2 and the second transistors 3, respectively. When significantly more than two second transistors are implemented (n>>2), such as more than 5, more than 10, or even more than 20 second transistors 3 are implemented, the voltage blocking capability and the on-resistance of the semiconductor arrangement 1 are mainly defined by the arrangement 30 with the second transistors 3. The overall semiconductor arrangement 1 can be operated like a conventional power transistor, where in a conventional power transistor, an integrated drift region mainly defines the on-resistance and the voltage blocking capability. Thus, the arrangement 30 with the second transistors 3 has a function that is equivalent to the drift region in a conventional power transistor. The arrangement 30 with the second transistors 30 will, therefore, be referred to as active drift region (ADR) or active drift zone (ADZ). The overall semiconductor device arrangement 1 of FIG. 1 can be referred to as ADZ transistor or ADR transistor (ADZ transistor) or as ADRFET (ADZFET), when the first semiconductor device is implemented as a MOSFET.

When the semiconductor device arrangement 1 is in an off-state, the voltage applied between the first and second load terminals 12, 13 is distributed such that a part of this voltage drops across the load path 22-23 of the first transistor 2, while other parts of this voltage drop across the load paths of the second transistors 3. However, there may be cases in which there is no equal distribution of this voltage to the second transistors 3. Instead, those second transistors 3 that are closer to the first semiconductor device 2 may have a higher voltage load than those second transistors 3 that are more distant to the first semiconductor device 2.

In order to more equally distribute the voltage to the second transistors 3, the semiconductor arrangement optionally includes voltage limiting means $10_1$-$10_n$ that are configured to limit or clamp the voltage across the load paths of the second transistors 3. Optionally, a clamping element $10_0$ is also connected in parallel to the load path (between the source and drain terminals) of the first semiconductor device 2. These voltage clamping means $10_0$-$10_n$ can be implemented in many different ways. Just for illustration purposes the clamping means $10_0$-$10_n$ illustrated in FIG. 5 include Zener diodes $10_0$-$10_n$, with each Zener diode $10_0$-$10_n$ being connected in parallel with the load path of one of the second transistors 3 and, optionally, the first transistor 2.

Instead of the Zener diodes $10_0$-$10_n$, tunnel diodes, PIN diodes, avalanche diodes, or the like, may be used as well. According to a further embodiment (not illustrated), the individual clamping elements $10_0$-$10_n$ are implemented as transistors, such as, for example, p-type MOSFETs when the second transistors 3 are n-type MOSFETs. Each of these clamping MOSFETs has its gate terminal connected to its drain terminal, and the load path (the drain-source path) of each MOSFET is connected in parallel with the load path of one second transistor 3.

The individual clamping elements, such as the Zener diodes $10_0$-$10_n$ illustrated in FIG. 5 can be integrated in the same semiconductor body as the first transistor 2 and the second transistors 3. However, these clamping elements could also be implemented as external devices arranged outside the semiconductor body.

Figure 6:
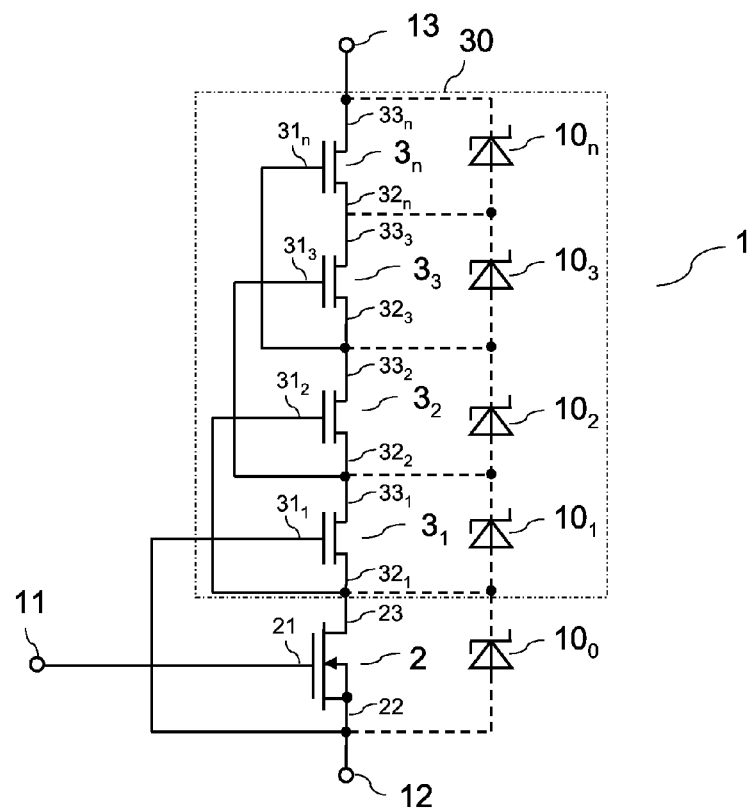
FIG. 6 illustrates a second embodiment of an implantation of at least one of the first and second semiconductor switches of the half-bridge circuit.

FIG. 6 illustrates a further embodiment for implementing one or both of the switches $1_1$, $1_2$ of the half-bridge. The switch 1 of FIG. 6 is implemented with a depletion MOSFET, specifically with an n-type depletion MOSFET, as the first transistor 2. Like in the embodiment of FIG. 5, the second transistors 3 of FIG. 6 are implemented as depletion transistors, specifically as n-type depletion transistors.

As explained above in connection with FIG. 5, the switching behavior of the switch 1 is dependent on the switching behavior of the first transistor 2. Thus, in the switch 1 of FIG. 6, the switching behavior is dependent on the switching behavior of the depletion MOSFET 2. For explanation purposes it is assumed that the depletion MOSFET 2 is an n-type depletion MOSFET with a negative threshold voltage. In this case, the first transistor 2, and, therefore, the switch 1, is switched on as long as the voltage between the gate terminal 11 and the source terminal 12 of the depletion MOSFET 2 is above the negative threshold voltage. The switch 1 switched off when the voltage between the gate terminal 1 and the source terminal 12 decreases to below the negative threshold voltage.

Figure 7:
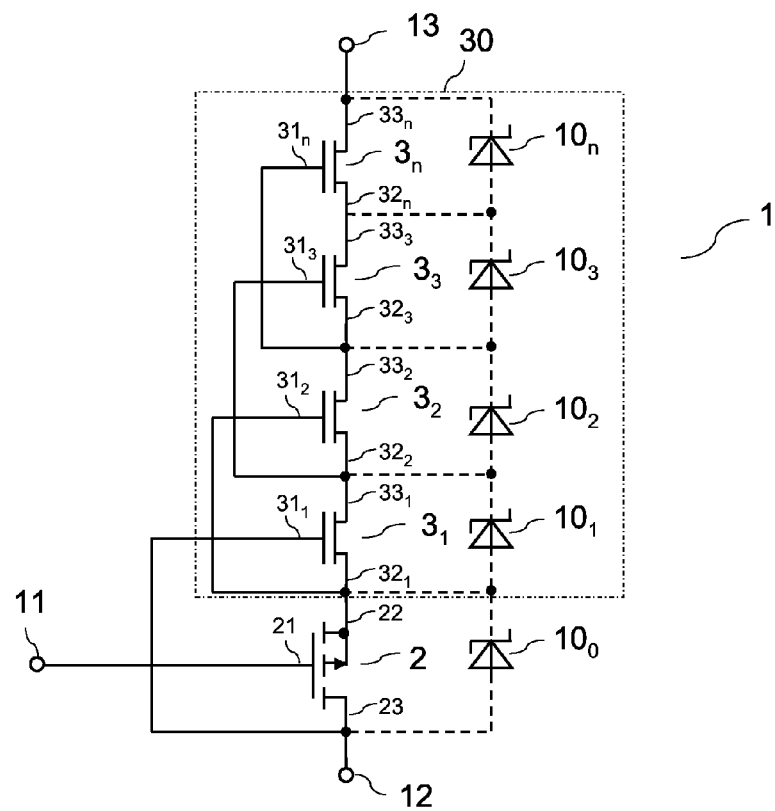
FIG. 7 illustrates a third embodiment of an implantation of at least one of the first and second semiconductor switches of the half-bridge circuit.

FIG. 7 illustrates a further embodiment of the switch 1 that can be used to implement one of the first and second switches $1_1$, $1_2$. In this embodiment, the first transistor 2 is implemented as a p-type enhancement MOSFET, while the second transistors 3 are implemented as n-type depletion MOSFETs or JFETs. The first transistor 2 is connected such that its source terminal 22 is connected to the source terminal $32_1$ of the 1st second transistor $3_1$, while the drain terminal 23 forms the first load terminal 21 of the switch 1.

The switch 1 is switched on, when the p-type MOSFET 2 is switched on, and is switched off, when the p-type MOSFET 2 is switched off.

The switch 1 that is implemented with a first transistor 2 and a plurality of second transistors 3 has low capacitive losses, because the only capacitance that provides for the losses, when the switch 1 is cyclically switched on and off, is an output capacitance of the first transistor 2. This output capacitance includes an internal drain-source capacitance and an internal gate-drain capacitance when the first transistor 2 is implemented as a MOSFET. Since the first transistor 2 can be implemented with a low voltage blocking capability, the output capacitance of the overall semiconductor device arrangement 1 (the ADZFET) with the plurality of transistors 2, 3 connected in series is low as compared to the output capacitance of one high-voltage transistor that has a voltage blocking capability corresponding the voltage blocking capability of the ADZFET 1. The low output capacitance keeps switching losses low and results in high switching speeds, which means in fast transistions between the on-state and the off-state of the switch 1, and vice versa. Gate-source, gate-drain and drain-source capacitances of the second transistors 3 are also charged and discharged when the switch 1 is switched on and off. However, electrical charges required for charging the gate-source capacitances of the second transistors 3 are mainly kept in the arrangement 30 with the second transistors 3, so that these charges do not have to be provided by the drive circuit 20 in each switching process. The turn-on process of the ADZFET 1 can be faster and can have lower losses than the turn-off of the ADZFET 1 or vice versa depending on the threshold voltage of the second transistors. Using ADZFETs in a half-bridge configuration allows to take advantage of the faster turn-on process twice, turn-on the low-side switch to pull the output OUT to the reference potential (ground) GND and turn-on the high-side switch to pull the output OUT to the supply potential V1.

FIG. 8 illustrates an embodiment of a half-bridge and a corresponding drive circuit 20. In the present embodiment, the high-side switch $1_2$ is implemented with a first transistor 2 and a plurality of second transistors $3_1$-$3_n$ as explained with reference to FIGS. 5 to 7 before. Specifically, the first transistor 2 is implemented as an n-type depletion MOSFET, while the second transistors are implemented as n-type depletion MOSFETs or n-type JFETs. The low-side switch $1_1$ of the half-bridge can be implemented as a conventional semiconductor switch, such as, e.g. an n-type MOSFET, an IGBT or a bipolar junction transistor (BJT). However, it is also possible to implement the low-side switch $1_1$ to include a first transistor and a plurality of second transistors. According to one embodiment, the low-side switch $1_1$ is implemented with a first transistor and a plurality of second transistors, wherein the first transistor in the low-side switch $1_1$ is implemented as an n-type enhancement MOSFET, as illustrated in FIG. 5.

The drive circuit 20 receives an input signal Sin and is configured to drive the high-side switch $1_2$ and the low-side switch $1_1$ dependent on the input signal Sin such that only one of the high-side switch $1_2$ and the low-side switch $1_1$ is switched on at the same time. For explanation purposes it is assumed that the input signal Sin assumes one of two different signal levels, namely a first signal level and a second signal level. For explanation purposes it is further assumed that the drive circuit 20 is configured to switch on the low-side switch $1_1$ and to switch off the high-side switch $1_2$ when the input signal Sin has the first signal level, and to switch on the high-side switch $1_2$ and switch off the low-side switch $1_2$ when the input signal Sin has the second signal level. The operating principle of the drive circuit 20 is explained with reference to FIG. 9 below. FIG. 9 illustrates timing diagrams of the input signal Sin and of other signals occurring in the drive circuit 20. In FIG. 9, a high signal level of the input signal Sin represents the first signal level, while a low signal level represents the second signal level.

Referring to FIG. 8, the drive circuit 20 includes a control circuit 203 that receives the input signal Sin and is configured to generate the first drive signal $S1_1$ of the low-side switch $1_1$ dependent on the input signal Sin. For explanation purposes it is assumed that the first drive signal $S1_1$ may assume one of two different signal levels, namely an on-level that switches the low-side switch $1_1$ on, and an off-level that switches the low-side switch $1_1$ off. For explanation purposes it is further assumed that the on-level of the first drive signal $S1_1$ is a high signal level, while the off-level is a low signal level.

Referring to FIG. 9, the control circuit 203 is configured to generate an on-level of the first drive signal $S1_1$ after a delay time Td1 after the input signal Sin has assumed the first signal level. Referring to the explanation above, the high-side switch $1_2$ is switched off when the input signal Sin assumes the first signal level and after the delay time Td1 the low-side switch $1_1$ is switched on. During the delay time Td1, the high-side switch $1_2$ is switched off before the low-side switch $1_1$ switches on in order to prevent that the high-side switch $1_2$ and the low-side switch $1_1$ are switched on at the same time. Referring to FIG. 9, the control circuit 203 is further configured to generate an off-level of the first drive signal $S1_1$ when the input signal Sin assumes the second signal level.

Referring to FIG. 8, the drive circuit 20 further includes a switching element 204 connected between the gate and source terminals 21, 22 of the first transistor 2. Thus, the switching element 204 is connected in parallel with an internal gate-source capacitance $C_{GS}$ of the first transistor 2. It is commonly known that in a MOSFET, such as the depletion MOSFET 2 of FIG. 8, a charging state of the gate-source capacitance defines the switching state (on or off) of the MOSFET. The n-type depletion MOSFET of FIG. 2 is in an on-state when the gate-source-voltage, which is the voltage between the gate terminal 21 and the source terminal 22, is zero, that is, when the gate-source-capacitance $C_{GS}$ is discharged. When the switching element 204 is switched on it discharges the gate-source capacitance $C_{GS}$, so that the first transistor 2 and, therefore, the high-side switch $1_2$ is switched on. The switching element 204 receives a drive signal S204 from the control circuit 203. The switching element 204 is switched on when the drive signal S204 has an on-level, and is switched off, when the drive signal S204 has an off-level. Just for explanation purposes it is assumed that the on-level of the drive signal S204 is a high signal level, while the off-level is a low signal level.

Referring to FIG. 8, the drive circuit 20 further includes a further switching element 202 connected between the control terminal $11_1$ of the high-side switch $1_2$ (the gate terminal 21 of the first transistor 2), and the terminal for the reference potential GND. Optionally, a resistor 205 is connected in series with the switching element 202. The further switching element 202 receives a drive signal S202 from the control circuit 203. This drive signal S202 may assume one of two signal levels, namely an on-level that switches the further switching element 202 on and an off-level that switches the further switching element 202 off.

Each of the switching element 204 and the further switching element 202 may be implemented as a bidirectionally blocking switch. A bidirectionally blocking switch is a switch that, when switched off, is configured to block voltages with a first polarity and voltage with a second polarity opposite the first polarity. An embodiment of a bidirectionally blocking switch suitable to be used in the switching element 204 or the further switching element 202 is illustrated in FIG. 9. The switch includes a series circuit with a first transistor N1 and a second transistor P1 of opposite conduction types that have their load paths connected in series. In the embodiment of FIG. 9, the first transistor N1 is implemented as n-type enhancement MOSFET, while the second transistor is implemented as p-type enhancement MOSFET. Each of the MOSFET includes an integrated diode (body diode). By virtue of these body diodes each of the MOSFETs N1, P1 is configured to only block voltages of one polarity, namely those voltage that reverse bias the corresponding body diode, while the MOSFETs conduct when voltages are applied that forward bias the corresponding body diode.

Referring to FIG. 9, the two MOSFETs N1, P1 are interconnected such that the body diodes are connected back-to-back, so that voltages of both polarities may be blocked and such that the switch 202/204 only conducts dependent on the drive signal S202/S204. This can be obtained by connecting the source terminal of the n-type MOSFET with the drain terminal of the p-type MOSFET P1. The control terminals (gate terminals) of the two transistors N1, P1 are connected, so as to both receive the same drive signal S202/S204.

The further switching element 202 has a voltage blocking capability that is high enough to block the voltage between the first supply potential V1 and the reference potential GND, which will be referred to as supply voltage in the following. However, there is no need for the further switching element 202 to carry a high current. The voltage between the first supply potential V1 and the reference potential GND is, e.g. 400V, 600V, 800V, 1200V, or higher.

Referring to FIG. 8, the series circuit with the first transistor 2 and the plurality of second transistors $3_1$-$3_n$ in the high-side switch $1_2$ has a tap T at which the electrical potential at one circuit node of this series circuit can be tapped off. In the embodiment of FIG. 8, the tap T is connected to a circuit node between the first transistor 2 and the 1st second transistor $3_1$. However, this is only an example. Alternatively, the tap T is connected to a circuit node that is further distant to the first transistor 2. A voltage limiting element 201 is connected between the tap T and the gate terminal 21 of the first transistor 2. This voltage limiting element 201 may be implemented as a Zener diode or as a series circuit with Zener diodes and limits a voltage difference between the tap T and the gate terminal of the first transistor 2 to a predefined voltage that is defined by the breakthrough voltage of the voltage limiting element 201.

Figure 10:
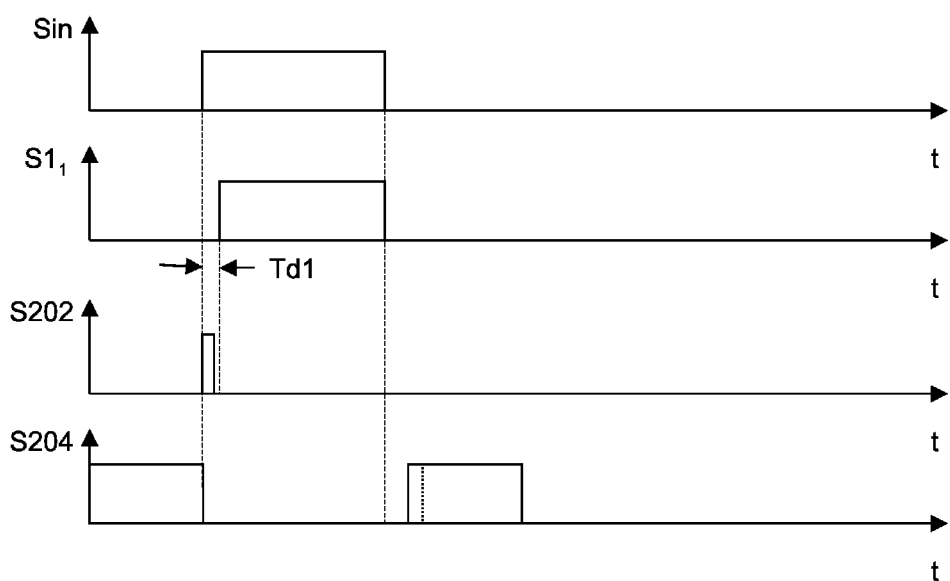
FIG. 10 shows timing diagrams illustrating the operating principle of the circuit arrangement of FIG. 8.

The operating principle of the drive circuit 20 of FIG. 8 is explained with reference to FIG. 10 below. FIG. 10 shows timing diagrams of the input signal Sin, of the first drive signal $S1_1$ and of the drive signals S202, S204 of the switching element 202 and the further switching element 204. The timing diagrams of FIG. 10 start at a time at which first drive signal $S1_1$ has an off-level (low-level) that switches the low-side switch $1_1$ off and the drive signal S204 of the switching element 204 has an on-level (high-level) that switches the switching element 204 on, so that the high-side switch $1_2$ is switched on. In this case, a voltage $V1_2$ across the high-side switch $1_2$ is very low as compared to the supply voltage (the voltage between the first supply potential V1 and the reference potential GND) and is only defined by the on-resistance of the high-side switch $1_2$ and a current through the high-side switch $1_2$. Thus, the electrical potential at the output terminal OUT approximately corresponds to the first supply potential V1, so that a voltage $V1_1$ across the low-side switch $1_1$ approximately corresponds to the supply voltage. The electrical potential at the tap T approximately corresponds to the first supply potential V1.

When the input signal Sin changes to the first signal level (indicating that the low-side switch $1_1$ should be switched on and the high-side switch $1_2$ should be switched off) the switching element 204 is switched off and the further switching element 202 is switched on. When the further switching element 202 switches on, the electrical potential at the gate terminal 21 of the first transistor 2 decreases to below the electrical potential at the output OUT and the source terminal 22, respectively. Thus, the gate-source capacitance $C_{GS}$ is charged so that the gate-source-voltage of the first transistor 2 becomes negative, so as to switch off the first transistor 2. The absolute value of the gate-source voltage of the first transistor 2 is limited by the voltage limiting element 201 in order to prevent high gate source-voltages. According to one embodiment, the absolute value of the gate-source voltage is limited by the voltage limiting element 201 to voltages between 3V and 50V, dependent on the breakthrough voltage of the voltage limiting element 201.

The absolute value of the gate-source voltage is limited by the voltage limiting element 201 as follows. As long as the low-side switch $1_1$ is switched off, the electrical potential at the tap T approximately corresponds to the electrical potential at the output OUT and approximately corresponds to the supply potential V1. The electrical potential at the output OUT corresponds to the source potential of the first transistor 2. When the further switching element 202 switches on, the electrical potential at the gate terminal 21 of the first transistor 2 decreases until the electrical potential at the gate terminal 21 corresponds to the electrical potential at the tap T minus the breakthrough voltage limiting element 201. Thus, the (negative) gate-source-voltage across the gate-source capacitance $C_{GS}$ corresponds to the voltage across the voltage limiting element 201.

Referring to FIG. 10, the switching element 202 is switched off (after the gate-source-capacitance has been charged) before the low-side switch $1_1$ switches on. When the low-side switch $1_1$ switches on, the electrical potential at the output OUT decreases and approximately corresponds to the reference potential GND. The high-side switch $1_2$ is kept in the off-state until the switching element 204 is again switched on in order to discharge the gate-source-capacitance $C_{GS}$ after the input signal Sin changes to the second signal level. The switching element 204 may be kept switched on as long as the first transistor 2 should be switched on. However, it is also possible to switch on the switching element 204 only for a short time period (illustrated in dotted lines in FIG. 10) in order to discharge the gate-source capacitance $C_{GS}$ and to switch on the first transistor 2. The gate source capacitance $C_{GS}$ will stay discharged until the further switching element 202 again charges the gate-source capacitance $C_{GS}$ in order to switch off the second transistor 2.

When the high-side switch 2 is switched off, the electrical potential at the tap T increases. In the embodiment of FIG. 8, the tap corresponds to the drain terminal 23 of the first transistor, so that a voltage between the tap T and the source terminal 22 of the first transistor 2 corresponds to the drain voltage V2 of the first transistor. In order to keep the high-side switch 2 in the off-state, the gate-source capaci-tance $C_{GS}$ should not be discharged such that the (negative) gate-source voltage $V_{GS2}$ increases to above the pinch-off voltage of the first transistor. The gate-source capacitance $C_{GS}$ would be discharged when the voltage V201 across voltage limiting element 201 would increase to the voltage limit. Thus, by suitably adjusting the voltage limit of the voltage limiting element 201, discharging of the gate-source capacitance may be prevented. This is explained in the following:

Referring to FIG. 8, $$V_{DS2}=V201+V_{GS2} => V201=V_{DS2}-V_{GS2} \qquad (1).$$

Thus, in order to keep the gate-source voltage $V_{GS2}$ below the negative pinch off-voltage, the voltage limit of the voltage limiting element 201 should at least equal the drain-source voltage $V_{DS2}$ plus the magnitude of the pinch off-voltage. Referring to FIG. 8, the drain-source voltage $V_{DS2}$ may be limited by the further voltage limiting element $10_0$ connected in parallel with the drain source path of the first transistor 2. Let, e.g., the breakthrough voltage of the further voltage limiting element $19_0$ be 10V and the pinch-off voltage be −10V. In this case, the voltage limit of voltage limiting element should at least be 20V (=10V−(−10V)).

The first semiconductor device (first transistor) 2 and the second semiconductor devices (second transistors) 3 of one switch 1 that are represented by circuit symbols in the figures explained above can be implemented in many different ways. Some illustrative embodiments for implementing the first transistor 2 and second transistors 3 are explained below.

Figure 11A:
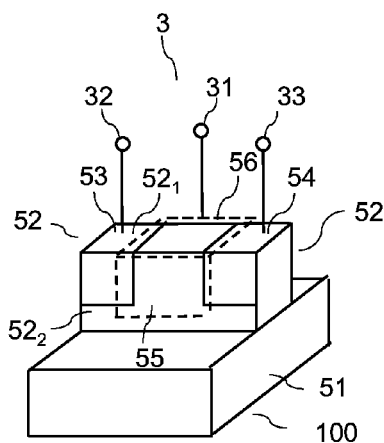
FIGS. 11A to 11C illustrates a first embodiment of one second semiconductor device implemented as FINFET.
Figure 11B:
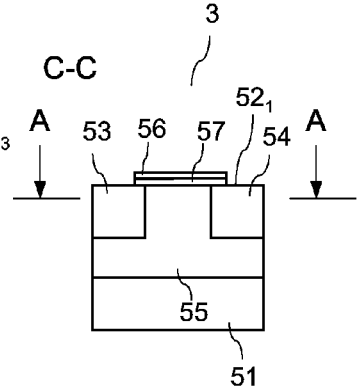
Figure 11C:
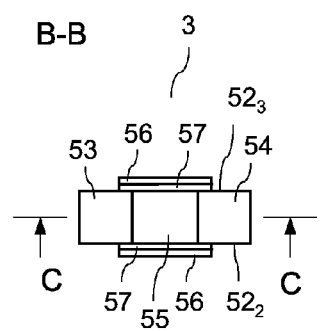

FIG. 11A shows a perspective view of one second transistor 3. FIG. 11B shows a vertical cross sectional view and FIG. 11C shows a horizontal cross sectional view of this second transistor 3. FIGS. 11A, 11B, 11C only show that section of the semiconductor body 100 in which the second transistor 3 is implemented. Active regions of the first semiconductor device 2 and active regions of neighbouring second transistors are not shown. The second transistor 3 according to FIGS. 11A to 11C is implemented as a MOSFET, specifically as a FINFET, and includes a source region 53, a drain region 54 and a body region 55 that are each arranged in a fin-like semiconductor section 52, which will also be referred to as "semiconductor fin" in the following. The semiconductor fin is arranged on a substrate 51. In a first horizontal direction, the source and drain regions 53, 54 extend from a first sidewall $52_2$ to a second sidewall $52_3$ of the semiconductor fin 52. In a second direction perpendicular to the first direction the source and drain regions 53, 54 are distant from one another and are separated by the body region 55. The gate electrode 56 (illustrated in dashed lines in FIG. 11A) is dielectrically insulated from the semiconductor fin 52 by a gate dielectric 57 and is adjacent to the body region 55 on the sidewalls $52_2$, $52_3$ and on a top surface $52_1$ of semiconductor fin 52.

Figure 12A:
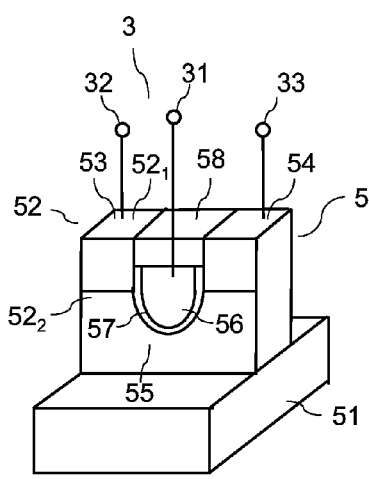
FIGS. 12A to 12C illustrates a second embodiment of one second semiconductor device implemented as FINFET.
Figure 12B:
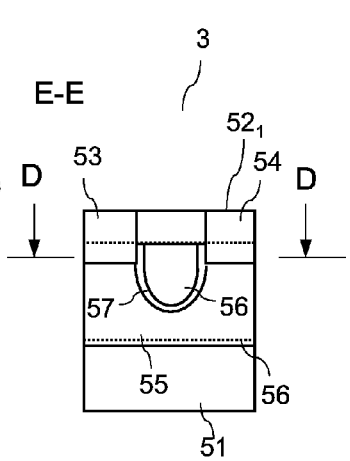
Figure 12C:
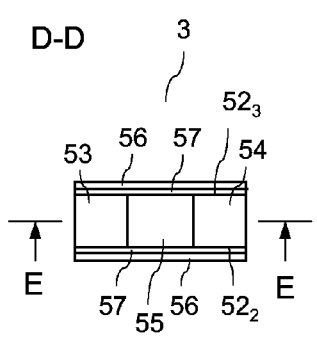

FIGS. 12A to 12C illustrate a further embodiment of one second transistor 3 implemented as a FINFET. FIG. 12A shows a perspective view, FIG. 12B shows a vertical cross sectional view in a vertical section plane E-E, and FIG. 12C shows a horizontal cross sectional view in horizontal section plane D-D. The vertical section plane E-E extends perpendicular to the top surface $52_1$ of the semiconductor fin 52 and in a longitudinal direction of the semiconductor fin 52. The horizontal section plane D-D extends parallel to the top surface $52_1$ of the semiconductor fin. The "longitudinal direction" of the semiconductor fin 52 corresponds to the second horizontal direction and is the direction in which the source and drain region 53, 54 are distant from one another.

The transistor 3 according to FIGS. 12A to 12C is implemented as a U-shape-surround-gate-FINFET. In this transistor, the source region 53 and the drain region 54 extend from the first sidewall $52_2$ to the second sidewall $52_3$ of the semiconductor fin 52 in the first horizontal direction, and are distant from one another in the second horizontal direction (the longitudinal direction of the semiconductor fin 52) that is perpendicular to the first horizontal direction. Referring to FIGS. 12A and 12B, the source region 53 and the drain region 54 are separated by a trench which extends into the body region 55 from the top surface $52_1$ of the semiconductor fin and which extends from sidewall $52_2$ to sidewall $52_3$ in the first horizontal direction. The body region 55 is arranged below the source region 53, the drain region 54 and the trench in the semiconductor fin 52. The gate electrode 56 is adjacent to the body region 55 in the trench and along the sidewalls $52_2$, $52_3$ of the semiconductor fin 52 and is dielectrically insulated from the body region 55 and the source and drain regions 53, 54 by the gate dielectric 57. In an upper region of the trench, which is a region in which the gate electrode 56 is not arranged adjacent to the body region 55, the gate electrode 56 can be covered with an insulating or dielectric material 58.

The second transistors of FIGS. 11A to 11C and of FIGS. 12A to 12C are, for example, implemented as depletion transistors, such as an n-type or a p-type depletion transistors. In this case, the source and drain regions 53, 54 and the body region 55 have the same doping type. The body region 55 usually has a lower doping concentration than the source and drain regions 53, 54. The doping concentration of the body region 55 is, e.g., about 2E18 $cm^{-3}$. In order to be able to completely interrupt a conducting channel in the body region 55 between the source region 53 and the drain region 54, the gate electrode 56 along the sidewalls $52_2$, $52_3$ of the semiconductor fin 52 completely extends along the semiconductor fin 52 in the second horizontal direction (the longitudinal direction). In the vertical direction the gate electrode 56 along the sidewalls $52_2$, $52_3$ extends from the source and drain regions 53, 54 to at least below the trench. According to a further embodiment, the body regions 55 have a doping type complementary to the doping type as the source and drain regions 53, 54 and include a channel region of the same doping type as the drain and source regions 53, 54 along the gate dielectric 57. In this embodiment, not the complete body region 55 but only the channel region along the gate dielectric needs to be depleted in order to switch off the respective second transistor 3.

Referring to FIGS. 11A and 12A, the source region 53 is connected to the first load terminal (source terminal) 32, the drain region 54 is connected to the second load terminal (drain terminal) 33, and the gate electrode 56 is connected to the control terminal (gate terminal) 31. These terminals are only schematically illustrated in FIGS. 11A and 12A.

A thickness of the semiconductor fin 52, which is the dimension of the semiconductor fin in the first horizontal direction, and the doping concentration of the body region 55 are adjusted such that a depletion region controlled by the gate electrode 56 can extend from sidewall $52_2$ to sidewall $52_3$ in order to completely interrupt a conducting channel between the source and the drain region 53, 54 and to switch the second transistor 3 off. In an n-type depletion MOSFET a depletion region expands in the body region 55 when a negative control (drive) voltage is applied between the gate electrode 56 and the source region 53 or between the gate terminal 31 and the source terminal 32, respectively. Referring to the explanation provided with reference to FIG. 1, this drive voltage is dependent on the load voltage of the first semiconductor device 2, or is dependent on the load voltage of another one of the second transistors 3. How far the depletion region expands perpendicular to the sidewalls $52_2$, $52_3$ is also dependent on the magnitude of the control voltage applied between the gate terminal 31 and the source terminal 32. Thus, the thickness of the semiconductor fin 52 and the doping concentration of the body region 55 are also designed dependent on the magnitude of the control voltage that can occur during the operation of the semiconductor device arrangement.

Implementing the FINFETs illustrated in FIGS. 11A to 11C and 12A to 12C as U-shape-surround-gate-FINFET, in which the channel (body region) 55 has an U-shape and the gate electrode 56 is also arranged on sidewalls $52_2$, $52_3$ and on a top surface $52_1$ of the semiconductor fin 130 is only an example. These FINFETs could also be modified (not illustrated) to have the gate electrode 56 implemented with two gate electrode sections arranged on the sidewalls $52_2$, $52_3$ but not on the top surface $52_1$ of the semiconductor fin 52. A FINFET of this type can be referred to as double-gate FINFET. Each of the FINFETs explained above and below can be implemented as U-shape-surround-gate-FINFET or as double-gate FINFET. It is even possible to implement the individual second transistors 3 as different types of MOSFETs or FINFETs in one integrated circuit.

According to one embodiment, the body region 55 of a second transistor 3 includes a contact (not illustrated in FIGS. 11A-11C and 12A-12C) for electrically contacting the body region 55. Via that contact, the body region 55 of one second transistor may be coupled to the source region or source terminal of the second transistor, respectively. The body contact is, in particular useful in those cases in which the body region 55 is doped complementary to the source and drain region 53, 54 (and includes a depletable channel region of the same doping type as the source and drain regions 53, 54 along the gate dielectric). The body contact helps to remove minority charge carriers from the body region 55. In an n-type depletion transistor with a p-doped body region 55, these minority charge carriers are holes.

Each of the second transistors 3 and the first semiconductor device 2 can be implemented as a FINFET. These individual FINFETs can be implemented in different ways to form the semiconductor arrangement 1.

Figure 13:
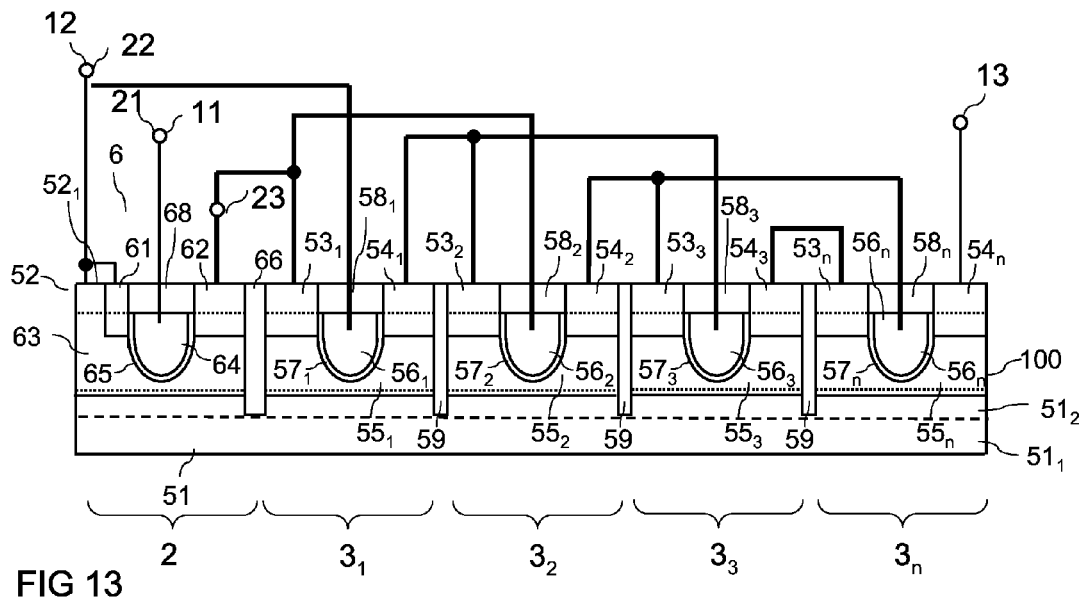
FIG. 13 illustrates a vertical cross sectional view of a semiconductor body according to a first embodiment in which a first semiconductor device and a plurality of second semiconductor devices are implemented in one semiconductor fin.

FIG. 13 illustrates a vertical cross sectional view of a semiconductor fin 52 in which active regions (source, drain and body regions) of a first semiconductor device 2 and of n second transistors 3 are arranged. In this embodiment, the first semiconductor device 2 and the second transistors are implemented as U-shape-surround-gate FINFET or as double-gate FINFET. In FIG. 13, like reference numbers are used to denote like features as in FIGS. 11A to 11C and 12A to 12C. In FIG. 13 the reference numbers of like features of the different second transistors $3_1$-$3_n$ have different indices (1, 2, 3, n).

Referring to FIG. 13, the active regions of neighboring second transistors 3 are insulated from each other by dielectric layers 59 which extend in a vertical direction of the semiconductor fin 52. These dielectric layers 59 may extend down to or down into the substrate 51. Further, the dielectric layers 59 extend from sidewall to sidewall of the semiconductor fin 52. However, this is out of view in FIG. 13. The active regions of the first semiconductor device 2 are dielectrically insulated from active regions of the 1st second transistor $3_1$ by a further dielectric layer 66 that also extends in a vertical direction of the semiconductor fin 52. In the first semiconductor device 2, a source region 61 and a drain region 62 are separated by a body region 63. The gate electrode 64 that is arranged in the trench (and the position of which at the sidewalls of the semiconductor fin is illustrated by dotted lines), extends from the source region 61 along the body region 63 to the drain region 62. The source region 61 is connected the first load terminal 22 that forms the first load terminal 12 of the semiconductor arrangement 1, the drain region 62 is connected to the second load terminal 23, and the gate electrode 64 is connected to the control terminal 21 that forms the control terminal 11 of the semiconductor arrangement 1. The body region 63 is also connected to the first load terminal 22.

The first semiconductor device 2 is, for example, implemented as an enhancement MOSFET. In this case, the body region 63 is doped complementarily to the source and drain regions 61, 62. In an n-type MOSFET, the source and drain regions 61, 62 are n-doped while the body region 63 is p-doped, and in a p-type MOSFET, the source and drain regions 61, 62 are p-doped while the body region 63 is n-doped.

According to one embodiment, the substrate 51 is doped complementarily to the active regions of the second transistors 3 and to the source and drain regions 61, 62 of the first semiconductor device 2. In this case, there is a junction isolation between the individual second transistors 3. According to a further embodiment (illustrated in dashed lines), the substrate is an SOI substrate and includes a semiconductor substrate $51_1$ and an insulation layer $51_2$ on the semiconductor substrate $51_1$. The semiconductor fin 52 is arranged on the insulation layer. In this embodiment, there is a dielectric layer between the individual second transistors 3 in the substrate 51.

Figure 14:
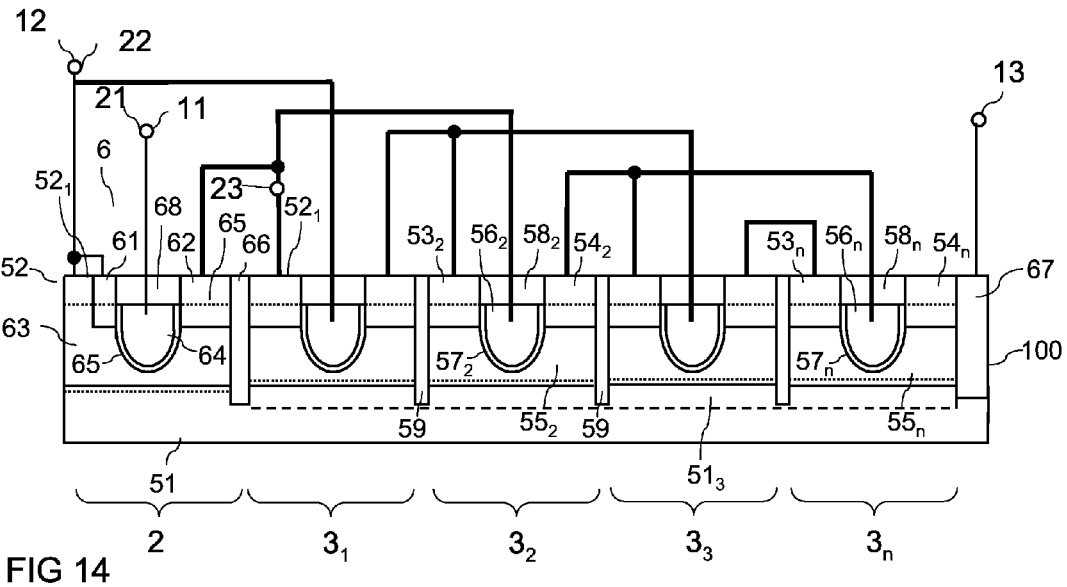
FIG. 14 illustrates a vertical cross sectional view of a semiconductor body according to a second embodiment in which a first semiconductor device and a plurality of second semiconductor devices are implemented in one semiconductor fin.

According to yet another embodiment, illustrated in FIG. 14, the substrate 51 has the same doping type as the active regions of the second transistors 3 and as the source and drain regions 61, 62 of the first semiconductor device 2. In this embodiment, the gate electrode 64 of the first semiconductor device 2 extends to the substrate, so that there is a conducting path in the body region between the source region 61 and the substrate 51 when the first semiconductor device 2 is in the on-state. Further the substrate is connected to the second load terminal 13 of the semiconductor arrangement through a contact region 67 of the same doping type as the substrate 51. The contact region 67 is more highly doped than the substrate 51 and extends from the first surface $52_1$ of the semiconductor fin 52 to the substrate. The contact region 67 may adjoin the drain region $54_n$ of the n-th second transistor 3. The contact region 67 is optional. A connection between the second load terminal 13 and the substrate 51 could also be provided through the drain and body regions $54_n$, $55_n$ of the second transistor $3_n$.

In the semiconductor arrangement of FIG. 14, the substrate 51 forms a current path that is parallel to the current path through the second transistors 3 or that is parallel to the ADZ. The substrate 51 is similar to the drift region in a conventional power transistor. In this embodiment, the body regions 55 of the individual second transistors 3 are coupled to the drift region 51.

According to further embodiment (illustrated in dashed lines in FIG. 14) the substrate 51 includes a semiconductor layer $51_3$ doped complementarily to remaining sections of the substrate 51 and to the body regions 55 of the second transistors 3. This layer $51_3$ is arranged between the body regions 55 of the second transistors 3 and those sections of the substrate acting as a drift region and provides a junction insulation between the individual second transistors 3 in the substrate 51.

Each of the first semiconductor device 2 and the second transistors 3 (referred to as devices in the following) may include a plurality of identical cells (transistor cells) that are connected in parallel. Each of these cells can be implemented like the first semiconductor device 2 or like the second transistors 3, respectively, illustrated in FIGS. 10 and 11. Providing a plurality of cells connected in parallel in one device can help to increase the current bearing capability and to reduce the on-resistance of the individual device.

Figure 15:
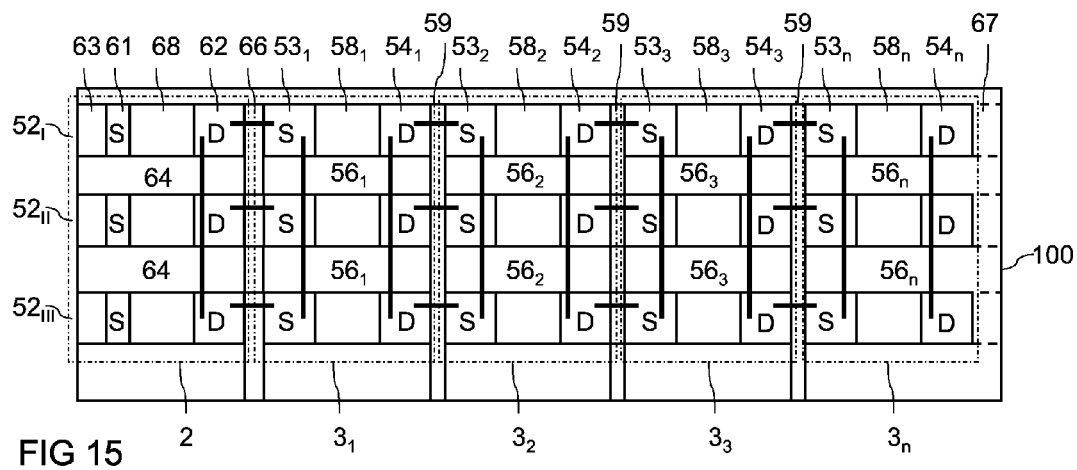
FIG. 15 illustrates a top view of a semiconductor body according to a third embodiment in which a first semiconductor device and a plurality of second semiconductor devices each including several FINFET cells are implemented.

FIG. 15 illustrates a top view on a semiconductor arrangement according to a first embodiment which includes a first semiconductor device 2 and a plurality of second transistors 3, with each of these devices having a plurality (from which three are illustrated) cells connected in parallel. The individual cells of one device are implemented in different semiconductor fins $52_I$, $52_{II}$, $52_{III}$. Each of these cells has a source region 61, 53 that is additionally labeled with "S" in FIG. 15, and a drain region 62, 54 that is additionally labeled with "D" in FIG. 15. The cells of one device are connected in parallel by having the source regions of the one device connected together and by having the drain regions of the one device connected together. These connections as well as connections between the load terminals of the different devices are schematically illustrated in bold lines in FIG. 15. Connections between the control terminals (gate terminals) and the load terminals of the different devices are not illustrated in FIG. 15. The connections between the cells and the different devices can be implemented using conventional wiring arrangements arranged above the semiconductor body and contacting the individual active regions (source and drain regions) through vias. Those wiring arrangements are commonly known so that no further explanations are required in this regard. The individual cells of one device 2, $3_1$, $3_2$, $3_3$, $3_n$ have a common gate electrode 64, $56_1$, $56_2$, $56_3$, $56_n$ arranged in the U-shaped trenches of the individual semiconductor fins and in trenches between the individual fins. These "trenches between the fins" are longitudinal trenches along the fins. All gates 64, $56_1$, $56_2$, $56_3$, $56_n$ are electrically isolated from each other by a dielectric 66 and 59.

Figure 16:
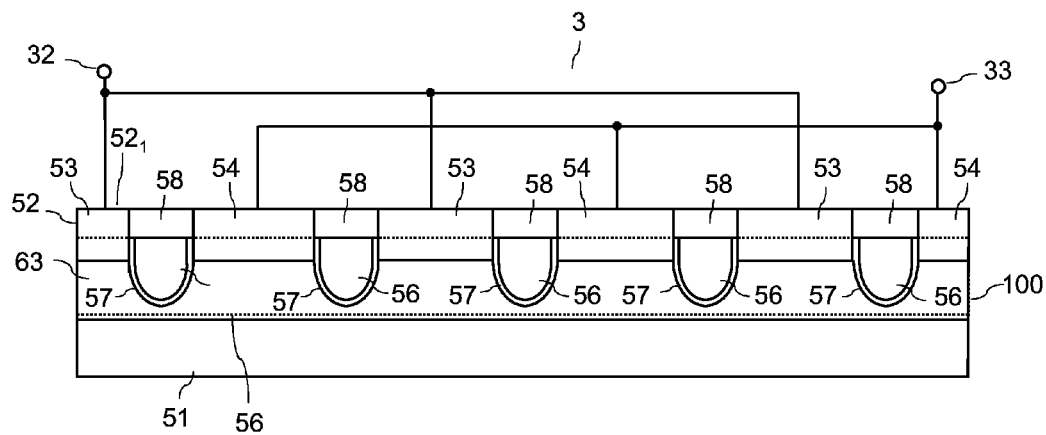
FIG. 16 illustrates a vertical cross sectional view of one second semiconductor device including several FINFET cells connected in parallel.

FIG. 16 illustrates a further embodiment for implementing one second transistor 3 with a plurality of transistor cells. In this embodiment, a plurality of transistor cells of the second transistor 3 are implemented in one semiconductor fin. In the longitudinal direction of the semiconductor fin 52, source and drain regions 53, 54 are arranged alternatingly with a source region 53 and a neighboring drain region 54 being separated by one (U-shaped) trench that accommodates the gate electrode 56. The source regions 53 are connected to the first load terminal 22, and the drain regions 54 are connected to the second load terminal 23, so that the individual transistor cells are connected in parallel. The gate electrode 56 is common to the individual transistor cells and extends along the sidewalls of the semiconductor fin 52 in the longitudinal direction. Each source region 53 and each drain region 54 (except for the source and drain regions arranged at the longitudinal ends of the semiconductor fin 52) is common to two neighboring transistor cells.

The body region 55 may have the same doping type as the source and drain regions 53, 54, or may be doped complementary to the source and drain regions 53, 54. In the latter case, the body region 55 may include a depletable channel region of the same doping type as the source and drain regions 53, 54 along the gate dielectric, and may include a body contact (not illustrated) electrically contacting the body region 55 and electrically connected top the source region 53 or the source terminal 32, respectively.

The concept of providing several transistor cells in one semiconductor fin explained with reference to FIG. 16 is, of course, also applicable to the implementation of the first semiconductor device 2.

Figure 17A:
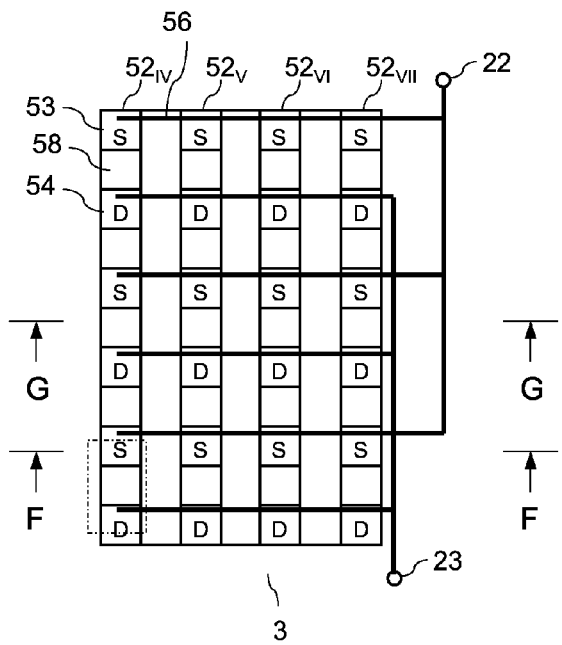
FIGS. 17A to 17C illustrates a further embodiment of one second semiconductor device including several FINFET cells connected in parallel.
Figure 17B:
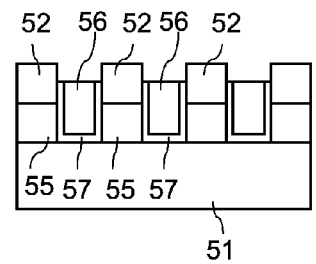
Figure 17C:
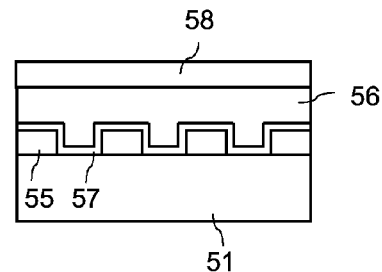

Referring to FIGS. 17A to 17C, one second transistor 3 may include a plurality of semiconductor fins $52_{IV}$, $52_V$, $52_{VI}$, $52_{VII}$, with each semiconductor fin $52_{IV}$-$52_{VII}$ including a plurality of transistor cells (one of these cells is highlighted by a dashed and dotted frame in FIG. 17A). FIG. 17A shows a top view of one second transistor 3, FIG. 17B shows a vertical cross sectional view in a section plane F-F cutting through source regions in different fins, and FIG. 17C shows a vertical cross sectional view in a section plane G-G cutting through the trenches with the gate electrode 56 in different fins. Referring to FIG. 17A, the source regions of the individual transistor cells are connected to the first load terminal 22 and the drain regions of the individual transistor cells are connected to the second load terminal 23 so that the individual transistor cells are connected in parallel. These connections are only schematically illustrated in FIG. 17A.

The concept of providing a plurality of semiconductor fins with each semiconductor fin including a plurality of transistor cells explained with reference to FIGS. 17A to 17C is, of course, also applicable to the implementation of the first semiconductor device 2.

Although only 20 transistor cells are illustrated in FIG. 17A, namely five cells in each of the four semiconductor fins $52_{IV}$-$52_{VII}$, one second transistor 3 or the first semiconductor device 2 may include up to several thousand or even up to several ten or several hundred million transistor cells connected in parallel. The individual transistor cells form a matrix of transistor cells that are connected in parallel. A device (first semiconductor device 2 or second transistor 3) having a plurality of transistor cells arranged in a matrix will be referred to as matrix device in the following.

Figure 18:
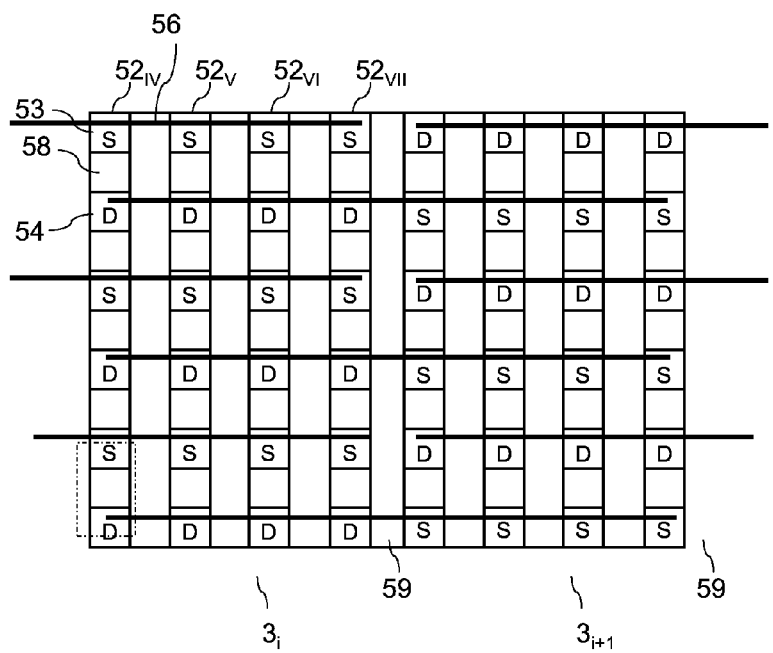
FIG. 18 illustrates two second semiconductor devices of the type illustrated in FIG. 17 connected in series.

FIG. 18 illustrates how second transistors implemented as matrix devices can be connected in series. For illustration purposes, only two second transistors $3_i$, $3_{i+1}$ are shown in FIG. 18. For connecting these two transistors in series, the source regions of the second transistor $3_{i+1}$ are connected to the drain regions of the transistor $3_i$. The source regions of the second transistor $3_i$ are connected to the drain regions of second transistors $3_{i-1}$ (not illustrated), and the drain regions of the second transistor $3_{i+1}$ are connected to the source regions of second transistors $3_{i+2}$ (not illustrated).

Figure 19:
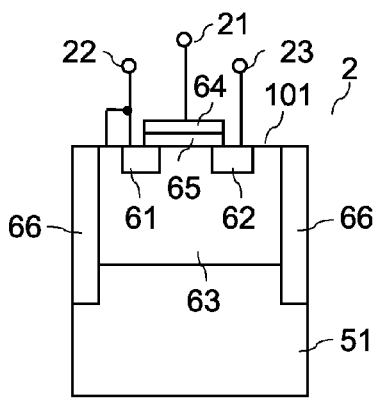
FIG. 19 illustrates a vertical cross sectional view of a first transistor according to a further embodiment.

FIG. 19 illustrates a vertical cross sectional view of a transistor cell of the first transistor 2 according to a further embodiment. Several of the transistor cells of FIG. 19 may be connected in parallel to form the first transistor 2. The transistor cell of FIG. 19 is implemented with a planar gate electrode 64. The gate electrode 64 is arranged above the first surface 101 of the semiconductor body 100 and is dielectrically insulated from the body region 63 by the gate dielectric 65. The source and drain regions 61, 62 are arranged in the region of the first surface 101 and are distant in a lateral direction of the semiconductor body 100. The body region 63 adjoins the substrate 51, where the substrate 51 may be implemented in accordance with one of the embodiments explained before. Further, the body region 63 is electrically connected to the source terminal 22. Referring to FIG. 19, the vertical dielectric layer 66 may extend through the body region 63 to or into the substrate 51. The vertical dielectric layer 66 may surround the body region 63 in a horizontal plane of the semiconductor body 100, which is a plane perpendicular to the section plane illustrated in FIG. 19. The first transistor 2 of FIG. 19 may be implemented as an enhancement transistor. In this case, the body region 63 is doped complementary to the source and drain regions 61, 62. Concerning the doping types of the individual device regions reference is made to the embodiments explained before.

Figure 20:
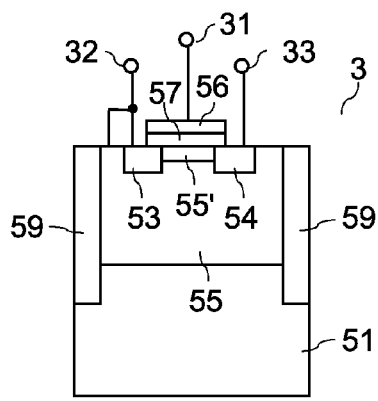
FIG. 20 illustrates a vertical cross sectional view of a second transistor according to a further embodiment.

FIG. 20 illustrates a vertical cross sectional view of a transistor cell of one second transistor 2 according to a further embodiment. Several of the transistor cells of FIG. 20 may be connected in parallel to form one second transistor 3. The transistor cell of FIG. 20 is implemented with a planar gate electrode 56. The gate electrode 56 is arranged above the first surface 101 of the semiconductor body 100 and is dielectrically insulated from the body region 55 by the gate dielectric 57. The source and drain regions 53, 54 are arranged in the region of the first surface 101 and are distant in a lateral direction of the semiconductor body 100. The body region 55 adjoins the substrate 51, where the substrate 51 may be implemented in accordance with one of the embodiments explained before. Further, the body region 55 is electrically connected to the source terminal 32. Referring to FIG. 20, the vertical dielectric layer 59 may extend through the body region 55 to or into the substrate 51. The vertical dielectric layer 59 may surround the body region 55 in a horizontal plane of the semiconductor body 100, which is a plane perpendicular to the section plane illustrated in FIG. 20.

The second transistor 3 of FIG. 20 may be implemented as a depletion transistor. In this case, the body region 55 is doped complementary to the source and drain regions 53, 54 and includes a channel region 55' of the same doping type as the source and drain regions 53, 54 along the gate dielectric 57. The channel region 55' extends from the source region 53 to the drain region 54. In an n-type depletion transistor, the source region 53, the drain region 54 and the channel region 55' are n-doped while the body region is p-doped. In a p-type depletion transistor, the doping types of these device regions are complementary to those in an n-type transistor.

Figure 21:
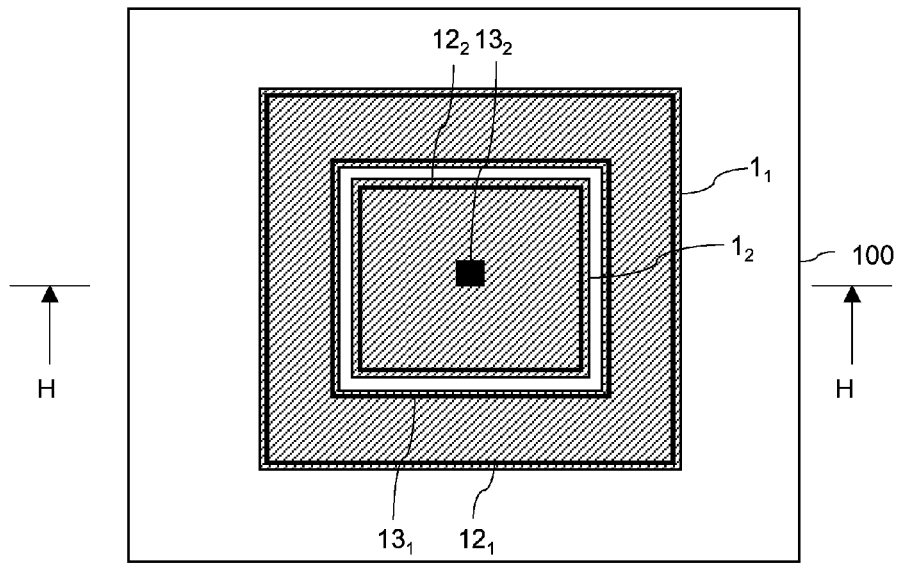
FIG. 21 schematically illustrates a top view of a semiconductor body in which a half-bridge is integrated.
Figure 22:
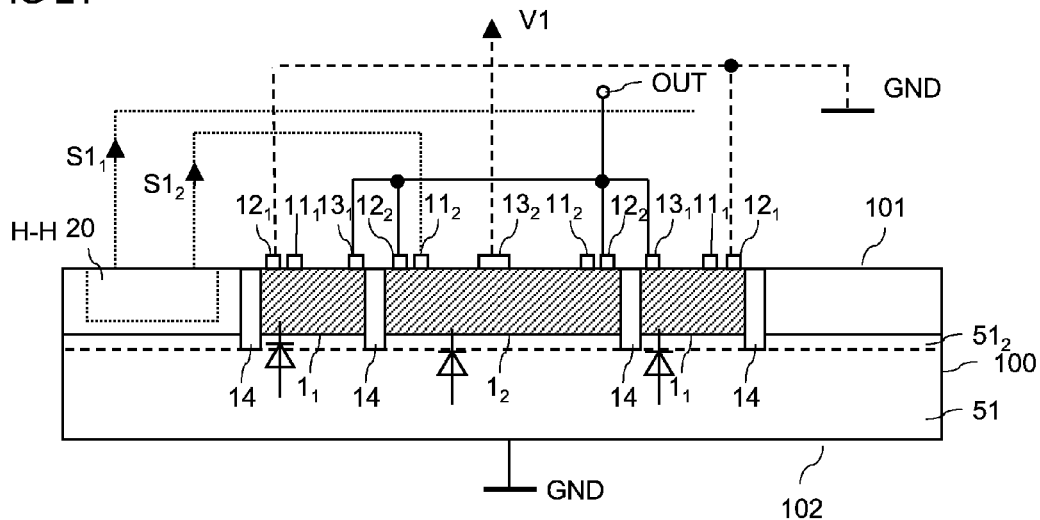
FIG. 22 illustrates a vertical cross sectional view of the semiconductor body of FIG. 19.
Figure 28:
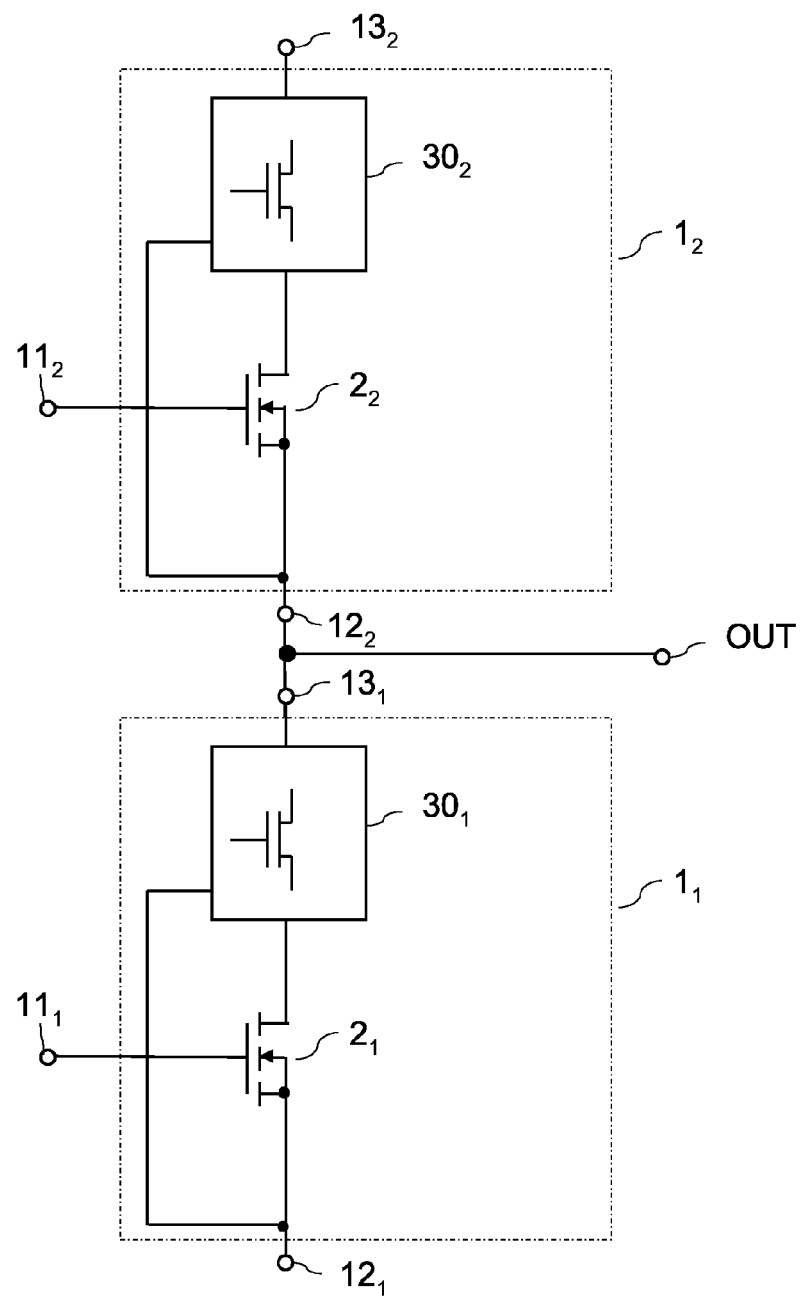
FIG. 28 illustrates a further embodiment of a half-bridge.

The half-bridge with the low-side switch $1_1$ and the high-side switch $1_2$ may be implemented in one common semiconductor body. Optionally, the drive circuit 20 and other logic circuitry is integrated in the same semiconductor body. An embodiment of implementing the low-side switch $1_1$ and the high-side switch $1_2$ in one semiconductor body 100 is explained with reference to FIGS. 21 and 22 below. FIG. 21 schematically illustrates a top view of a semiconductor body 100. FIG. 22 schematically illustrates a vertical cross sectional view of the semiconductor body 100 of FIG. 21 in the section plane H-H. In FIG. 21, reference numbers $1_1$, $1_2$ denote areas of the semiconductor body 100 in which the low-side switch $1_1$ and the high-side switch $1_2$, respectively, are integrated. Reference numbers $12_2$, $13_2$ denote the first and second load terminals of the high-side switch $1_2$, and reference numbers $12_1$, $13_1$ denote the first and second load terminals of the low-side switch $1_1$. Each of the low-side switch $1_1$ and the high-side switch $1_2$ may be implemented as explained with reference to FIGS. 11 to 20 before. Specifically, each of the low-side switch $1_1$ and the high-side switch $1_2$ may be implemented with a first transistor and a plurality of second transistors (as illustrated in FIG. 28) and each of these transistors may be implemented as a matrix device with a plurality of lateral transistor cells connected in parallel.

Referring to FIG. 21, the semiconductor area in which the low-side switch $1_1$ is integrated surrounds the semiconductor area in which the high-side switch $1_2$ is integrated. The second load terminal $13_2$ of the high-side switch $1_2$ is essentially in the center of the overall arrangement with the high-side switch $1_2$ and the low-side switch $1_1$, and the first load terminal $12_1$ of the low-side switch $1_1$ is essentially close to an edge of this overall arrangement. Referring to FIG. 1, the positive supply potential V1 may be connected to the second load terminal $13_2$ of the high-side switch $1_2$, while the reference potential GND may be connected to the first load terminal $12_1$ of the low-side switch $1_1$. Thus, the edge of the semiconductor area in which the high-side switch $1_2$ and the low-side switch $1_1$ are integrated is kept on the reference potential GND, while the supply voltage drops in a lateral direction of the semiconductor body 100 between the second load terminal $13_2$ and the first load terminal $12_2$ of the high-side switch $1_2$ or between the second load terminal $13_1$ and the first load terminal $12_1$ of the low-side switch $1_1$, namely dependent on the switching states of the high-side switch $1_2$ and the low-side switch $1_1$. The first load terminal $12_2$ of the high-side switch $1_2$ is close to an outer edge of that semiconductor area in which the high-side switch $1_2$ is implemented, and the second load terminal $13_1$ of the low-side switch $1_1$ is essentially close to an inner edge of that semiconductor area in which the low-side switch $1_2$ is integrated. Referring to FIG. 1, the output terminal OUT may be connected to the first load terminal $12_2$ of the high-side switch $1_2$ and the second load terminal $13_1$ of the low-side switch $1_1$. These load terminals may be connected in a conventional way using wiring or metallization arrangements above the semiconductor body 100 (not illustrated in FIG. 21). The output terminal OUT is not illustrated in FIG. 21.

Since the edge of the semiconductor area in which the high-side switch $1_2$ and the low-side switch $1_1$ are integrated is kept on the reference potential GND, logic circuits, such as the drive circuit 20 may be integrated in the semiconductor body 100 without requiring specific insulation means. The drive circuit 20 is schematically illustrated in the vertical cross sectional view of FIG. 22. According to a further embodiment, parts of the drive circuit 20, such as, e.g., switching elements 202, 204 of FIG. 8 may be integrated in the semiconductor body 100 in that area in which the low-side switch $1_1$ and the first transistor of the high-side switch $1_2$ is integrated. In the embodiments illustrated in FIGS. 21 and 22 this is the semiconductor area between the first load terminal $12_2$ of the high-side switch $1_2$ and the first load terminal $12_2$ of the low-side switch $1_1$.

Referring to FIG. 22, the low-side switch $1_1$ and the high-side switch $1_2$ are integrated in the semiconductor body 100 above a substrate 51. This substrate 51 may correspond to the substrate 51 explained with reference to FIGS. 10 to 20 before. The substrate 51 may include a semiconductor substrate doped complementarily to the active device regions of the first and second transistors and the low-side switch $1_1$ and the high-side switch $1_2$. For explanation purposes it is assumed that the first transistors and the second transistors in the high-side switch $1_2$ and the low-side switch $1_1$ are n-type transistors. In this case, the semiconductor substrate is p-doped.

This provides a junction isolation between the substrate 51 and the active device regions of each of the transistors in the ADZFET in the high-side switch $1_1$ and the second transistors of low-side switch $1_2$. The individual transistors in the high-side switch $1_1$ and the low-side switch $1_2$ may be implemented as explained with reference to FIGS. 10 to 18 before as enhancement or depletion devices. All dopings can be reversed to obtain a half-bridge with PFET devices.

Referring to FIG. 22, the substrate may be connected to the reference potential GND, so that pn-junction isolation (represented by diodes in FIG. 20) is always reverse biased). (In FIG. 20 den Switch extra beschreiben, hier direkter P-Kontakt von GND. Isolation 14 ist zwischen jedem Ketten-Transistor—wie können wir das in unterer Zeichnung einfügen ???)

According to a further embodiment, the substrate 51 is implemented as an SOI substrate.

Referring to FIG. 20, dielectric insulation regions 14 may be arranged between the semiconductor regions in which low-side switch $1_1$ and the high-side switch $1_2$ are integrated and between the overall region with the low-side switch $1_1$ and the high-side switch $1_2$ and other semiconductor regions, such as semiconductor regions in which the drive circuit 20 is implemented. These dielectric insulation regions 14 extend from a surface of the semiconductor body 100 into the substrate. When the substrate is an SOI substrate, the insulation layer $51_2$ (illustrated in dashed lines in FIG. 20) of the SOI substrate and the dielectric regions 14 form dielectric wells, with each dielectric well including a semiconductor region in which one of the low-side switch $1_1$ and the high-side switch $1_2$ are integrated. Referring to FIGS. 12 to 15 and 18, further dielectric regions (59 in these figures) may be arranged between the individual transistors of the series circuit with the first transistor 2 and the plurality of second transistors 3. According to a further embodiment (not illustrated) the dielectric insulation regions 14 extend through the semiconductor body 100 from the first surface 101 to an opposite second surface 102.

In order to ease understanding of the isolation between the individual transistors in the low-side and the high-side switch $1_1$, $1_2$ and the substrate, exemplary embodiments for implementing the first and second transistors in the low-side switch and the high-side switch $1_2$ are explained with reference to drawings below. In these drawings vertical cross sectional views of one transistor cell of the individual transistors and a section of the underlying substrate 51 is illustrated.

Figure 23:
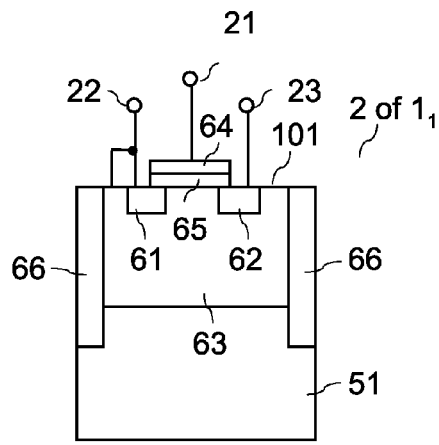
FIG. 23 illustrates a vertical cross sectional view of a first transistor of a low-side switch according to one embodiment.

FIG. 23 illustrates a vertical cross sectional view of one transistor cell of the first transistor 2 in the low-side switch $1_1$. The transistor cell of FIG. 23 is implemented as explained with reference to FIG. 19. The substrate 51 has the same doping type as the body region 63, so that the body region 63 and the source terminal 22 (that is connected to the body region 63) of the transistor $2_1$ are electrically connected to the substrate 51. Referring to FIG. 22, the substrate 51 and the source terminal of the first transistor $2_1$ of the low-side switch $1_1$ have the same electrical potential (GND in the embodiment of FIG. 22). The first transistor 2 may be implemented as an n-type enhancement transistor. In this case, the body region 63 and the substrate 51 are p-doped.

Figure 24:
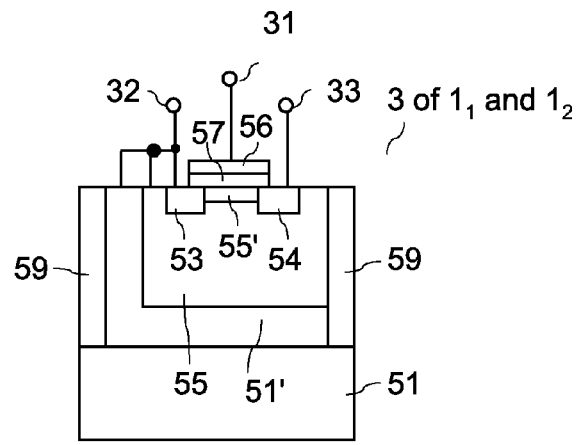
FIG. 24 illustrates a vertical cross sectional view of a second transistor of a low-side switch or a high-side switch according to one embodiment.

FIG. 24 illustrates a vertical cross sectional view of one transistor cell of one of the second transistors 3 in the low-side switch $1_1$ or the high-sides switch. The transistor of FIG. 24 is implemented as a depletion transistor in accordance with the embodiment of FIG. 21 and includes a body region 55 that is doped complementary to the source and drain regions 53, 54 and a channel region 55' of the same doping type as the source and drain regions 53, 54. A junction isolation is provided between the body region 55 and the substrate 51. This junction isolation is provided by a semiconductor region 51' that is doped complementary to the substrate 51 and the body region 55 and that is arranged between the substrate 51 and the body region 55. Optionally, the semiconductor region 51' is electrically connected to the source terminal 32. The first transistor 2 may be implemented as an n-type depletion transistor and the substrate 51 may be p-doped. In this case, the semiconductor region 51' is n-doped.

Figure 25:
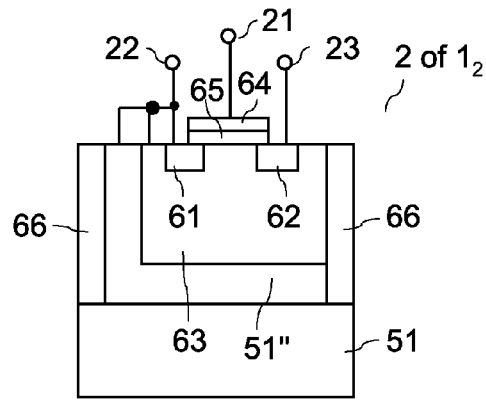
FIG. 25 illustrates a vertical cross sectional view of a first transistor of a high-side switch according to one embodiment.

FIG. 25 illustrates a vertical cross sectional view of one transistor cell of the first transistor 2 in the high-side switch 1$_2$. The transistor cell of FIG. 25 is implemented as explained with reference to FIG. 19, with the difference that a junction isolation is provided between the body region 63 and the substrate 51. This junction isolation is provided by a semiconductor region 51" that is doped complementary to the substrate 51 and the body region 63 and that is arranged between the substrate 51 and the body region 63. Optionally, the semiconductor region 51" is electrically connected to the source terminal 22. The first transistor 2 may be implemented as an n-type enhancement transistor and the substrate 51 may be p-doped. In this case, the semiconductor region 51" is n-doped.

Figure 26A:
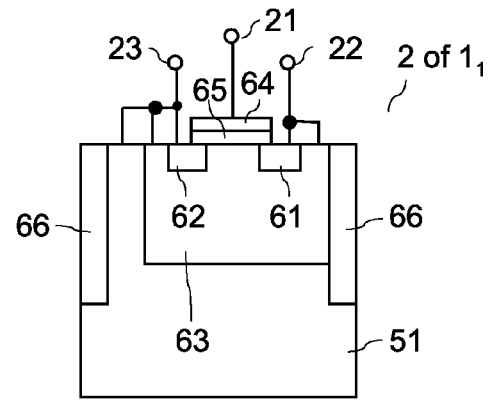
FIGS. 26A and 26B illustrates vertical cross sectional views of a first transistor of a low-side switch and a high-side switch, respectively, according to a further embodiment.

In case the first transistor 2 of the low-side switch 1$_1$ is implemented as a p-type transistor (as explained with reference to FIG. 7) with an n-doped body region 63, and p-doped source and drain regions 61, 62, the drain terminal 23 has the lowest electrical potential in the half-bridge. This first transistor 2 may be implemented in accordance with the embodiment of FIG. 26A. The transistor of FIG. 26A is based on the transistor of FIG. 23 with the difference that the substrate 51 is electrically connected to the drain terminal 23.

Figure 26B:
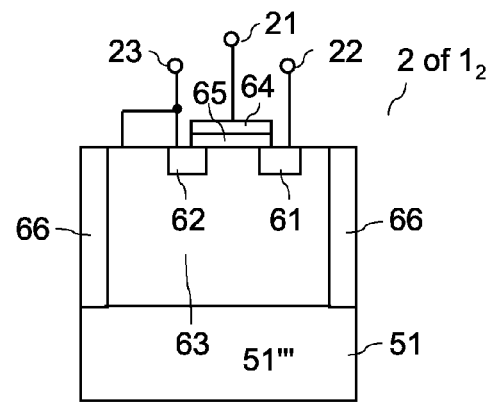

In case the first transistor 2 of the high-side switch 1$_2$ is implemented as a p-type transistor (as explained with reference to FIG. 7) with an n-doped body region 63, a junction isolation is already provided between the body region 55 and the p-substrate. In this case, the first transistor may be implemented as explained with reference to FIG. 23, with a p-doped substrate 51 and an n-doped body region 63. Optionally, one of the drain terminal and the source terminal is connected to the body region 63. A transistor with the drain terminal connected to the body region 63 is illustrated in FIG. 26B. Instead of the drain terminal 23, the source terminal 22 may be connected to the body region 63 (not illustrated in FIG. 26B).

The junction isolations between the substrate 51 and the body regions 55 of the second transistors 3 in both the high-side switch 1$_2$ and the low-side switch 1$_1$ (as illustrated in FIG. 24), and between the body region 63 of the first transistor 2 in the high-side switch (as illustrated in FIGS. 25 and 26B) is independent of the specific transistor topology. In the embodiments of FIGS. 24, 25 and 26B these transistors (the transistor cells of these transistors) are implemented with a planar gate electrode 64. However, this is only an example, any other type of gate electrode, such as a U-shape gate electrode or a double-sided gate electrode explained herein before, may be used as well. Equivalently, the topology of the first transistor 2 of the low-side switch is not restricted to the one illustrated in FIGS. 23 and 26A.

In the embodiments with junction isolations, the junction isolations may be omitted when the substrate 51 is implemented as an SOI substrate.

Figure 27:
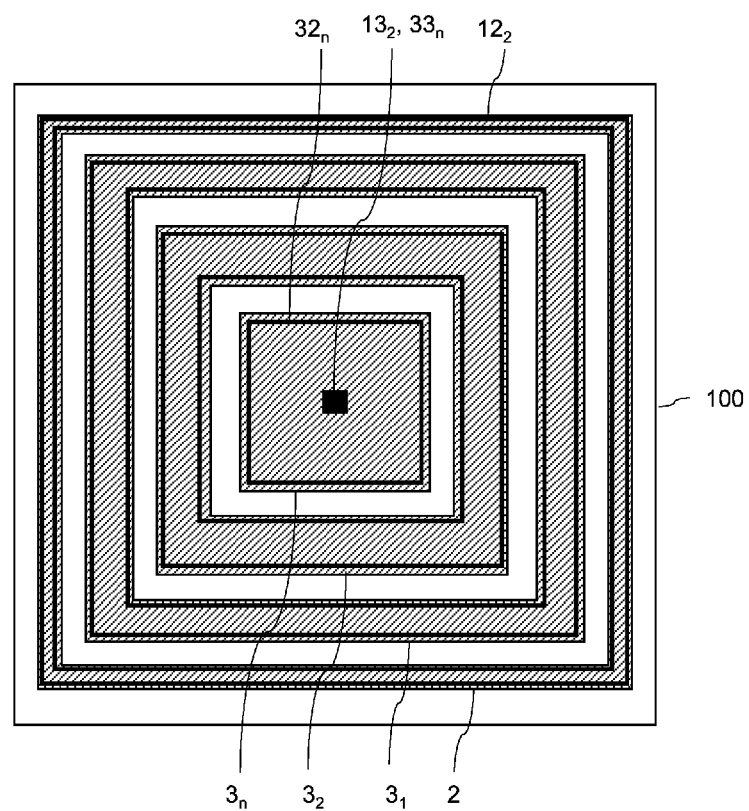
FIG. 27 illustrates a top view of a section of a semiconductor body in which one switch of a half-bridge is integrated.

FIG. 27 schematically illustrates in greater detail the implementation of one of the high-side switch 1$_2$ and the low-side switch 1$_1$ in the semiconductor body 100. FIG. 27 illustrates the implementation of the high-side switch 1$_2$. FIG. 27 schematically illustrates a top view of a section of the semiconductor body 100 in which active regions of the first transistor 2 and the second transistors 3 are implemented. Just for explanation purposes it is assumed that n=3. Referring to FIG. 27, the active device region of the n-th second semiconductor device 3$_n$ is surrounded by the active device region of the second semiconductor device directly connected to the n-th second semiconductor device 3$_n$, which is the second semiconductor device 3$_2$ in the embodiment illustrated in FIG. 27. In general, the active device region of an arbitrary second semiconductor device 3$_i$ is surrounded by the active device region of the second semiconductor device 3$_{i-1}$ directly connected to the semiconductor device 3$_i$, and the 1st second semiconductor device 3$_1$ is surrounded by the active device region of the first semiconductor device 2. The active device regions of the devices 2, 3, except for the n-th second semiconductor device 3$_n$ are basically ring shaped. In the illustration according to FIG. 27, these rings are rectangular rings. However, this is only an example, any other ring geometry may be used as well.

The individual semiconductor devices can be implemented as matrix devices, so that within each of the rings illustrated in FIG. 27 a matrix device as illustrated in FIG. 18 are integrated. According to one embodiment, several matrix devices are integrated in each of the ring-shaped regions illustrated in FIG. 27, where these matrix devices within each ring are connected in parallel so as to form one of the devices 2, 3. The load terminals of the individual devices can also be ring shaped and are schematically illustrated as bold lines in FIG. 27. Control terminals of the individual devices 2, 3, as well as the interconnection of the individual device 2, 3 is not illustrated in FIG. 27. For interconnecting the individual devices commonly known wiring and interconnection techniques can be employed.

In the semiconductor device arrangement according to FIG. 27 no additional edge termination structure is required, because in this embodiment the terminal having the highest electrical potential, namely the second load terminal 13, that is formed by the second load terminal 33$_n$ of the n-th second semiconductor device 3$_n$ is in the middle of the ring structure and is "shielded" by the other devices surrounding the n-th second semiconductor device 3. The "border" of the semiconductor device arrangement integrated in the semiconductor body 100 is formed by the active region of the first semiconductor device 2 with the first load terminal 12. The first load terminal is the terminal that has the lowest electrical potential in the semiconductor device arrangement, which may correspond to a reference potential or ground potential that is applied to the semiconductor body 100. However, this connection to reference or ground potential of the semiconductor body 100 is not explicitly illustrated in FIG. 27.

Referring to the explanation provided in connection with FIGS. 21 to 26, a half-bridge may be implemented by integrating a plurality of lateral transistor devices in a semiconductor body, wherein the transistor device connected to the reference potential (the first transistor 2 of the low-side switch 1$_1$ in the embodiments explained before) has one of its load terminals or its body region connected to the substrate while body regions of the other transistors are insulated from the substrate by junction isolations or dielectric isolations. Figure shows the circuit diagram of a half-bridge with a high-side switch 1$_2$ and a low-side-switch 1$_1$ that each include a first transistor 2$_1$, 2$_2$ and a plurality of second transistors in a transistor arrangement 30$_1$, 30$_2$. Each of these transistor arrangements 30$_1$, 30$_2$ may be implemented as explained with reference to FIG. 5 before.

The circuit arrangement of FIG. 28 may easily be modified by connecting one or more additional switches in series with the switches 1$_1$, 1$_2$.

Figure 29:
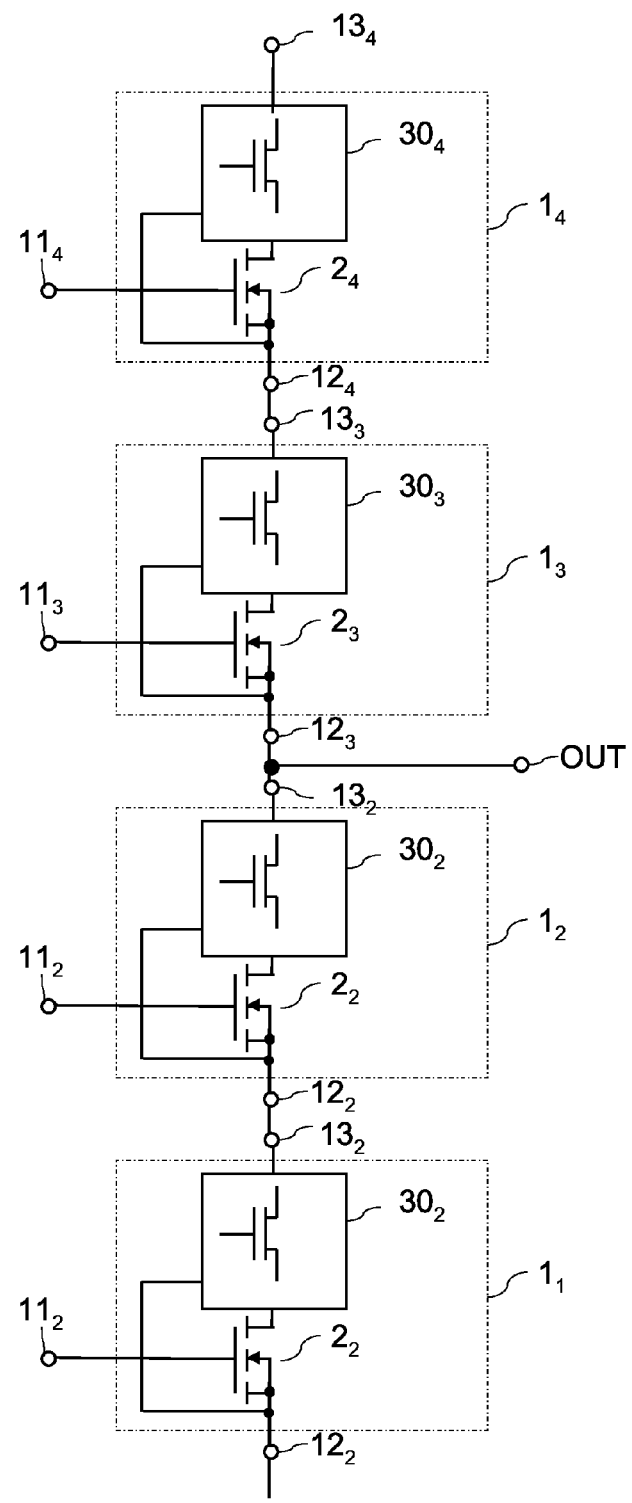
FIG. 29 illustrates a circuit arrangement with four switches connected in series.

FIG. 29 illustrates an embodiment of a circuit arrangement with four switches 1$_1$, 1$_2$, 1$_3$, 1$_4$ connected in series. Each of these switches 1$_1$, 1$_2$, 1$_3$, 1$_4$ includes a first transistor 2$_1$, 2$_2$, 2$_3$, 2$_4$ and a plurality (more than one) of second transistors that are only schematically illustrated as transistor arrangements 30$_1$, 30$_2$, 30$_3$, 30$_4$ in FIG. 29. The first transistors 2$_1$, 2$_2$, 2$_3$, 2$_4$ are implemented as n-type enhancement transistors in the embodiment of FIG. 29. However, this is only an example. Each of these transistors $2_1$, $2_2$, $2_3$, $2_4$ may be implemented as a transistor of another type as well. The transistors of the series circuit of switches may be integrated in one semiconductor body. The individual transistors of the first switch $1_1$ may be implemented like the transistors of the low-side switch $1_1$ explained with reference to FIGS. 21 to 26, and the individual transistors of the second, third and fourth switch $1_1$, $1_2$, $1_3$, $1_4$ may be implemented like the transistors of the high-side switch $1_2$ explained with reference to FIGS. 21 to 26.

The series circuit with the four switches of FIG. 29 may be used in an inverter.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement comprising:
a circuit with a first semiconductor switch and a second semiconductor switch, each of the first semiconductor switch and the second semiconductor switch comprising a load path and control terminal and having their load paths connected in series,
wherein each of the first and second semiconductor switches comprises:
a first semiconductor device having a load path and a control terminal, the control terminal coupled to the control terminal of the semiconductor switch;
a plurality of second semiconductor devices, each having a load path between a first load terminal and a second load terminal and a control terminal;
wherein the second semiconductor devices have their load paths connected in series and connected in series to the load path of the first semiconductor device, and
wherein the second semiconductor devices and the first semiconductor device are coupled such that one of the second semiconductor devices is controlled by a load path voltage of the first semiconductor device and the other ones of the second semiconductor devices are each controlled by a load path voltage of at least one second semiconductor device;
wherein the first semiconductor switch and the second semiconductor switch are integrated in a common semiconductor body, wherein the first semiconductor switch is implemented in a first area of the semiconductor body and the second semiconductor switch is implemented in a second area of the semiconductor body, and wherein in a horizontal plane of the semiconductor body the first area surrounds the second area.

2. The circuit arrangement of claim 1, wherein at least the second transistors of one switch are depletion MOSFETs or JFETs of a first conduction type.

3. The circuit arrangement of claim 2, wherein the first semiconductor device is a MOSFET of the first conduction type.

4. The circuit arrangement of claim 3, wherein the MOSFET is one of an enhancement MOSFET and a depletion MOSFET.

5. The circuit arrangement of claim 2, wherein the first semiconductor device is a MOSFET of a second conduction type complementary to the first conduction type.

6. The circuit arrangement of claim 1, further comprising:
a drive circuit configured to generate a first drive signal at the control terminal of the first semiconductor switch and to generate a second drive signal at the control terminal of the second semiconductor switch.

7. The circuit arrangement of claim 6, further comprising:
a terminal for a first supply potential connected to the load path of the second semiconductor switch;
a terminal for a second supply potential connected to the load path of the first semiconductor switch;
wherein at least the second semiconductor switch is implemented with a first semiconductor device and a plurality of second semiconductor devices, wherein the first semiconductor device is a depletion MOSFET, wherein the series circuit with the first semiconductor device and the second semiconductor device has at least one tap, and
wherein the drive circuit further comprises:
a voltage limiting element coupled between the tap and the control terminal of the second semiconductor switch;
a switching element coupled between the control terminal of the second semiconductor switch and a circuit node between the load paths of the first semiconductor switch and the second semiconductor switch; and
a further switching element coupled between the control terminal of the second semiconductor switch and the terminal for the second supply potential.

8. The circuit arrangement of claim 1, wherein the first semiconductor switch and the second semiconductor switch are integrated in a common semiconductor body.

9. The circuit arrangement of claim 1, wherein
the semiconductor body comprises a substrate of a first conduction type,
each of the first transistors and the second transistors of the first semiconductor switch and the second semiconductor switch includes a body region, and
wherein a junction isolation is between the substrate and the body region of each of the second transistors and between the substrate and the body region of the first transistor of the second semiconductor switch.

10. The circuit arrangement of claim 9, wherein each of the first and second transistors is a lateral transistor.

11. The circuit arrangement of claim 9, wherein each of the first and second transistors includes a plurality of transistor cells connected in parallel.

12. The circuit arrangement of claim 9, wherein the first transistor of the first semiconductor switch has at least one of the body region and one of the load terminals connected to the substrate.

13. A circuit arrangement comprising:
a circuit with a first semiconductor switch and a second semiconductor switch, each of the first semiconductor switch and the second semiconductor switch comprising a load path and control terminal and having their load paths connected in series,
wherein at least one of the first and second semiconductor switches comprises:
a first semiconductor device having a load path and a control terminal, the control terminal coupled to the control terminal of the semiconductor switch;
a plurality of second semiconductor devices, each having a load path between a first load terminal and a second load terminal and a control terminal;
wherein the second semiconductor devices have their load paths connected in series and connected in series to the load path of the first semiconductor device, and
wherein the second semiconductor devices and the first semiconductor device are coupled such that one of the second semiconductor devices is controlled by a load path voltage of the first semiconductor device and the other ones of the second semiconductor devices are each controlled by a load path voltage of at least one second semiconductor device; and
wherein the first semiconductor switch and the second semiconductor switch are integrated in a common semiconductor body, wherein the first semiconductor switch is implemented in a first area of the semiconductor body and the second semiconductor switch is implemented in a second area of the semiconductor body, and wherein in a horizontal plane of the semiconductor body the first area surrounds the second area.

14. The circuit arrangement of claim 1, wherein each but one of the second semiconductor devices has its control terminal directly connected to one of the first and second load terminals of a respective one of the second semiconductor devices, and wherein the one of the second semiconductor devices has its control terminal directly connected to one of the first and second load terminals of the first semiconductor device.

15. The circuit arrangement of claim 13, wherein each but one of the second semiconductor devices has its control terminal directly connected to one of the first and second load terminals of a respective one of the second semiconductor devices, and wherein the one of the second semiconductor devices has its control terminal directly connected to one of the first and second load terminals of the first semiconductor device.

* * * * *